United States Patent
Tan et al.

(10) Patent No.: US 9,614,027 B2
(45) Date of Patent: Apr. 4, 2017

(54) HIGH VOLTAGE TRANSISTOR WITH REDUCED ISOLATION BREAKDOWN

(71) Applicant: GLOBALFOUNDRIES Singapore Pte. Ltd., Singapore (SG)

(72) Inventors: Shyue Seng Tan, Singapore (SG); Ying Keung Leung, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/840,075

(22) Filed: Aug. 31, 2015

(65) Prior Publication Data
US 2017/0062554 A1  Mar. 2, 2017

(51) Int. Cl.
| | |
|---|---|
| *H01L 29/06* | (2006.01) |
| *H01L 29/792* | (2006.01) |
| *H01L 21/762* | (2006.01) |
| *H01L 21/31* | (2006.01) |
| *H01L 29/788* | (2006.01) |
| *H01L 29/66* | (2006.01) |
| *H01L 27/11521* | (2017.01) |
| *H01L 27/11568* | (2017.01) |

(52) U.S. Cl.
CPC .......... *H01L 29/0619* (2013.01); *H01L 21/31* (2013.01); *H01L 21/762* (2013.01); *H01L 27/11521* (2013.01); *H01L 27/11568* (2013.01); *H01L 29/0653* (2013.01); *H01L 29/66825* (2013.01); *H01L 29/66833* (2013.01); *H01L 29/788* (2013.01); *H01L 29/792* (2013.01)

(58) Field of Classification Search
CPC ........... H01L 29/66545; H01L 29/7835; H01L 29/0653; H01L 29/665; H01L 29/4975; H01L 29/4933; H01L 2924/00
USPC .................................................. 257/314, 316
See application file for complete search history.

(56) References Cited

U.S. PATENT DOCUMENTS

| | | | | | |
|---|---|---|---|---|---|
| 4,855,798 | A | * | 8/1989 | Imamura ........... | H01L 21/28518 257/751 |
| 4,998,150 | A | * | 3/1991 | Rodder ............... | H01L 29/0847 257/288 |

* cited by examiner

*Primary Examiner* — Julio J Maldonado
*Assistant Examiner* — Rodolfo D Fortich
(74) *Attorney, Agent, or Firm* — Horizon IP Pte. Ltd.

(57) ABSTRACT

Devices and methods for forming a device are disclosed. The device includes a substrate with a device region having a length and a width direction. An isolation region surrounds the device region of which an isolation edge abuts the device region. A transistor is disposed in the device region. The transistor includes a gate disposed between first and second source/drain (S/D) regions. A silicide block is disposed on the transistor. The silicide block covers at least the isolation edge adjacent to the gate. The silicide block prevents formation of a silicide contact at least at the isolation edge adjacent to the gate.

20 Claims, 30 Drawing Sheets

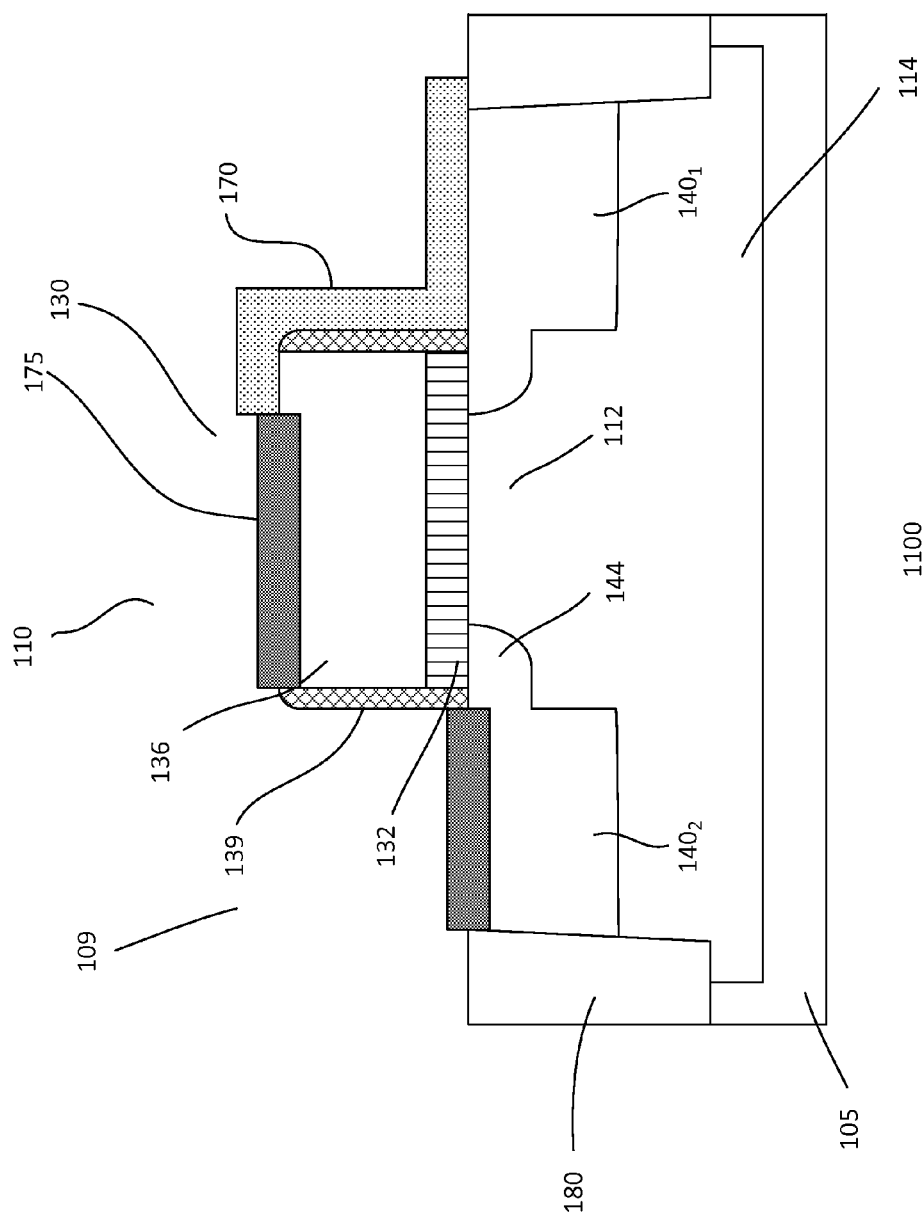

HIGH VOLTAGE TRANSISTOR WITH REDUCED ISOLATION BREAKDOWN

BACKGROUND

High voltage (HV) transistors are used for various applications, including non-volatile memory (NVM) devices. An important aspect of HV transistors is the gate oxide breakdown voltage (BV). The BV should be sufficiently high to enable reliable operation of the HV transistor. Furthermore, the BV of the transistors should result in a relatively tight BV spread across chips of a wafer and from wafer to wafer. Having a tight spread is particularly important in the case of NVM devices. A tight BV spread allows a NVM device to have a larger operating window and better yield.

However, as process technology advances, devices become narrower. Narrow devices, for example, at the 40 nm node or below, have been observed to suffer from wide BV spread. The wide BV spread negatively impacts the operating window of HV transistors.

From the foregoing discussion, it is desirable to provide HV transistors with tight BV spread.

SUMMARY

Embodiments generally relate to semiconductor devices and methods for forming a device. In one embodiment, a device is disclosed. The device includes a substrate with a device region having a length and a width direction. An isolation region surrounds the device region of which an isolation edge abuts the device region. A transistor is disposed in the device region. The transistor includes a gate disposed between first and second source/drain (S/D) regions. A silicide block is disposed on the transistor. The silicide block covers at least the isolation edge adjacent to the gate. The silicide block prevents formation of a silicide contact at least at the isolation edge adjacent to the gate.

In another embodiment, a method for forming a device is presented. The method includes providing a substrate with a device region having a length and a width direction. An isolation region surrounding the device region is formed of which an isolation edge abuts the device region. A transistor is formed in the device region. The transistor includes a gate formed between first and second source/drain (S/D) regions. A silicide block is provided on the transistor. The silicide block covers at least the isolation edge adjacent to the gate. The silicide block prevents formation of a silicide contact at least at the isolation edge adjacent to the gate.

These and other advantages and features of the embodiments herein disclosed will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 11a-11j show cross-sectional views of an embodiment of a process for forming a device.

DETAILED DESCRIPTION

Embodiments generally relate to semiconductor devices or integrated circuits (ICs). More particularly, embodiments relate to high voltage (HV) devices. For example, HV devices include HV transistors, such as metal oxide semiconductor (MOS) transistors. In some embodiments, the HV transistors may be used in non-volatile memory (NVM) devices. Other types of devices may also be applicable. The devices or ICs can be incorporated into or used with, for example, consumer electronic products, and particularly portable consumer products such as smart phones, mobile phones, tablets, TV displays and personal digital assistants (PDA).

Figure 1A:
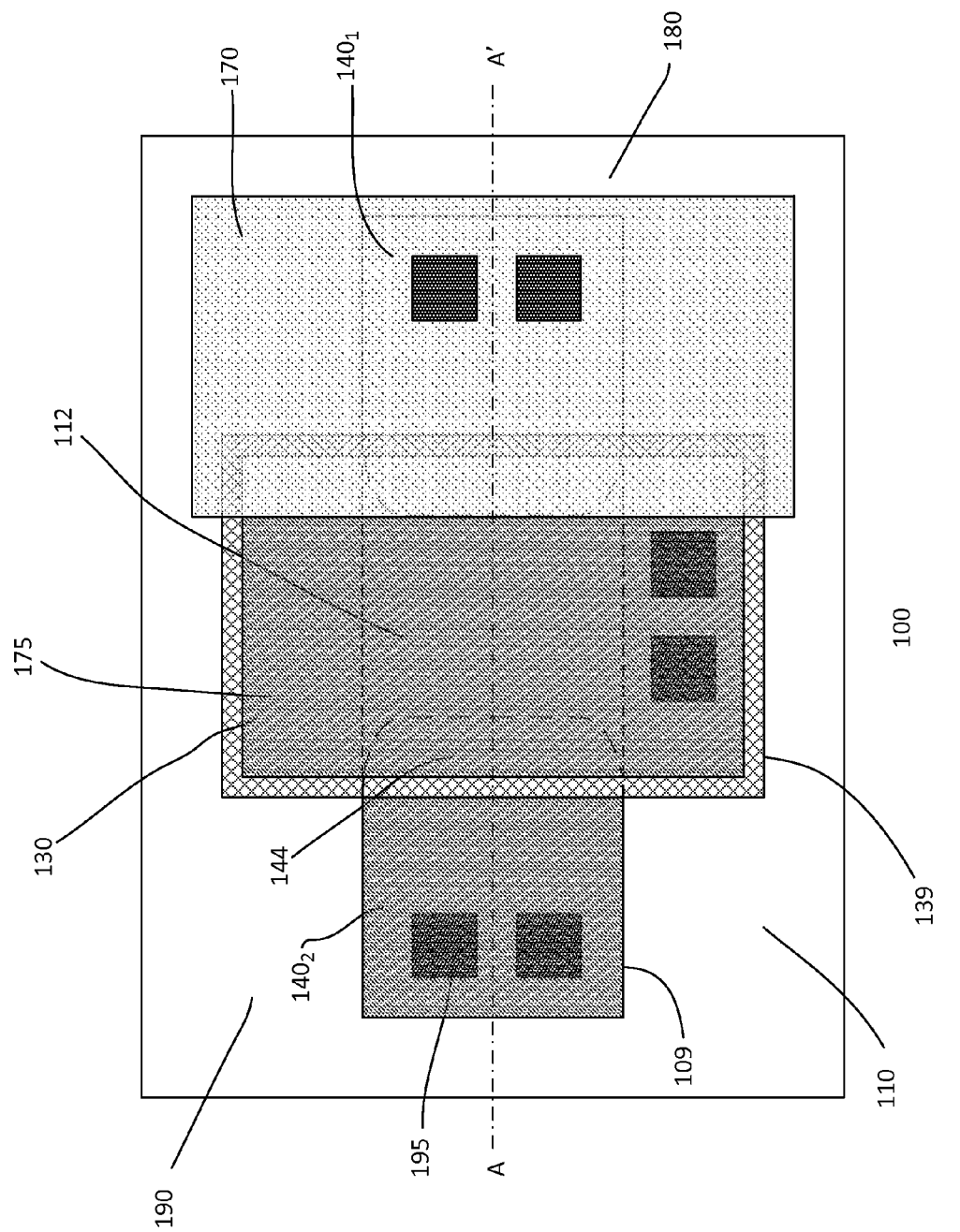
FIGS. 1a-1b show top and cross-sectional views of an embodiment of a device.
Figure 1B:
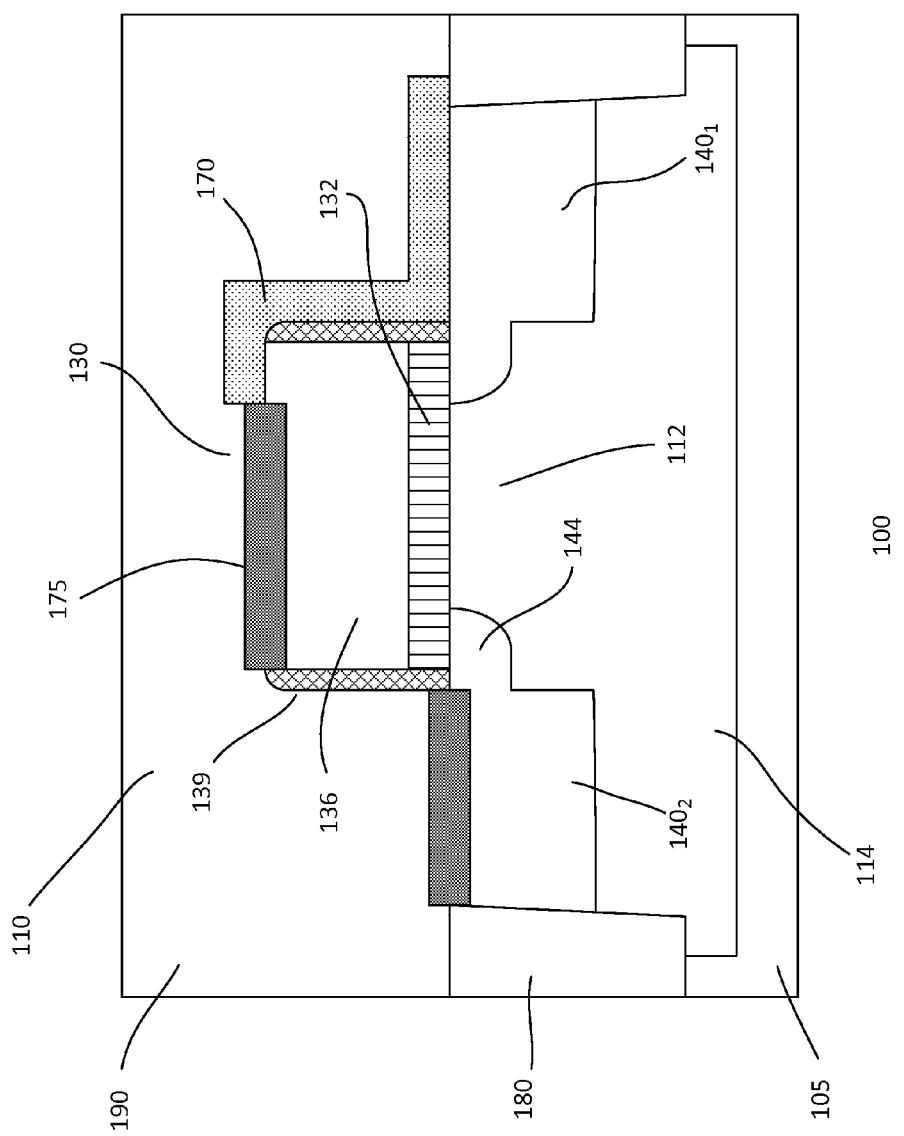

FIGS. 1a-1b show top and cross-sectional views of an embodiment of a device 100. The cross-sectional view is taken along A-A' in the channel length direction of the device. The perpendicular direction may be referred to as a channel width direction of the device. The device, for example, is an IC. Other types of devices may also be useful. Referring to FIGS. 1a-1b, the device includes a substrate 105. The substrate, for example, is a silicon substrate. Other types of substrates, such as silicon germanium, germanium, gallium arsenide, or crystal-on-insulator (COI) such as silicon-on-insulator (SOI), are also useful. The substrate may be a doped substrate. For example, the substrate can be lightly doped with p-type dopants. Providing a substrate with other types of dopants or dopant concentrations, as well as an undoped substrate, may also be useful.

The substrate includes a device or active region 109. In one embodiment, the device region is a HV device region suitable for a HV transistor 110. The HV transistor may operate in, for example, about 12-40 V regime and have a gate dielectric layer 132 with a thickness of, for example, about 200-1000 Å. The HV transistor may also operate in other suitable voltage ranges and have other suitable gate dielectric thicknesses, depending on design requirements and technology node. Providing other types of device regions may also be useful. The substrate may also include regions (not shown) for other types of circuitry, depending on the type of device or IC. For example, the device may also include regions for intermediate voltage (IV) or medium voltage (MV) and low voltage (LV) devices as well as an array region for a plurality of interconnected memory devices. Providing other types of device regions may also be useful.

The device region, as shown, has a rectangular shape. The length of the active region is along the direction of the channel length of the transistor while the width is along the channel width direction. Providing active regions with other shapes may also be useful.

In one embodiment, the device region 109 is isolated from other regions by an isolation region 180. The isolation region, for example, is a shallow trench isolation (STI) region. Other types of isolation regions may also be employed. The STI region, for example, extends to a depth of about 2000-5000 Å. Providing isolation regions which extend to other depths may also be useful. As shown, the isolation region surrounds a device region. For example, the isolation edge or STI edge abuts and surrounds the device region.

A doped device well 114 may be disposed in the device region 109. The well, for example, is a transistor well. Other types of wells may also be useful. The well is disposed within the isolation region. A depth of the well may be about 0.5-5 µm. Other depths for the well may also be useful. In one embodiment, the well is doped with second polarity type dopants and serves as a body for a first polarity type transistor. For example, the well may be doped with p-type dopants for an n-type transistor. Alternatively, the second polarity type dopants may be n-type. The well includes a dopant concentration for a HV transistor. For example, the dopant concentration of the well may be about 1E12-5E13/$cm^2$. Other dopant concentration for the well may also be useful, depending on, for example, design requirements.

The transistor 110 is disposed in the device region 109. In one embodiment, the transistor is a HV transistor. Other types of transistors may also be useful. The transistor includes a gate 130 disposed between first and second source/drain (S/D) regions $140_1$-$140_2$. One of the S/D regions may be referred to as a source and the other may be referred to as a drain. In one embodiment, the drain is subjected to high voltages during operation while the source may be coupled to ground. Other configurations of the source and drain may also be useful. In one embodiment, the first S/D region $140_1$ is the drain while the second S/D region $140_2$ is the source. The gate is disposed on the substrate while the S/D regions are disposed in the substrate. A gate, as shown, includes a gate electrode layer 136 disposed over a gate dielectric layer 132. The gate electrode layer, for example, may be a polysilicon gate electrode layer. The gate electrode may be about 600-1600 Å thick. Other types of gate electrodes as well as thicknesses may also be useful. As for the gate dielectric layer, it may be a silicon oxide or silicon oxynitride layer. The thickness of the gate dielectric layer may be, for example, about 200-1000 Å. Other types of gate dielectric or thicknesses may also be useful.

As shown in FIGS. 1a-1b, the gate 130 is a gate for a single transistor. For example, the gate is an island gate. In other embodiments, the gate may be a gate conductor. A gate conductor, for example, serves as a common gate for a plurality of transistors. The gate conductor, for example traverses a plurality of active regions to serve as a common gate. Other configurations of gates may also be useful.

First and second S/D regions $140_1$-$140_2$ are disposed in the substrate adjacent to the gate 130. The S/D regions are doped regions disposed in the substrate between the gate and isolation region. For example, doped regions are disposed in the substrate between the spacers on the gate dielectric layer and isolation region. The S/D regions, in one embodiment, are heavily doped with first polarity type dopants for a first polarity type transistor. For example, the S/D regions are heavily doped n-type ($n^+$) regions for an n-type transistor. Providing heavily doped p-type ($p^+$) regions may also be useful for a p-type transistor. The heavily doped regions, for example, have a dopant concentration of about 1E17-5E20/$cm^3$. Other dopant concentrations for the doped S/D regions may also be useful. The depth of the S/D regions is shallower than the STI regions. For example, the depth of the S/D regions may be about 0.1-1 µm. Providing S/D regions having other depths may also be useful.

Dielectric sidewall spacers 139 are disposed on sidewalls of the gate electrode and gate dielectric layers. The sidewall spacers, for example, may be silicon oxide spacers. Other types of dielectric spacers may also be useful. For example, the spacers may be formed with other types of dielectric materials or a combination of materials. The spacers, for example, may be composite spacers having multiple layers. The thickness of the spacers, for example, may be about 30 nm. Other thicknesses may also be useful. The thickness, for example, depends on the desired displacement of the S/D regions from the gate sidewalls.

As shown, the gate spacers 139 displace the S/D regions $140_1$-$140_2$ away from the gate 130. For example, inner edges (edges adjacent to the gate) of the S/D regions are aligned with about outer edges of the dielectric sidewall spacers. Displacing the S/D regions away from the gate reduces electric field built up from the S/D region to the channel 112. The displacement, for example, may be about 30 nm, which is equal to the thickness of the spacers.

In one embodiment, the S/D regions $140_1$-$140_2$ include lightly doped drain (LDD) extension regions 144. The LDD regions are lightly doped with first polarity type dopants (or the same as the S/D regions) for a first polarity type transistor. For example, the LDD regions are lightly doped n-type (n) regions for an n-type transistor. Providing lightly doped p-type ($p^-$) regions for a p-type transistor may also be useful. The LDD regions, for example, have a dopant concentration of about 5E16-5E19/$cm^3$. Other dopant concentrations for the LDD regions may also be useful. As shown, a depth of the LDD regions is shallower than the S/D regions. The depth of the LDD regions, for example, may be 40-80 nm. Providing LDD regions having other depths may also be useful. The LDD regions connect the S/D regions to the channel 112 under the gate.

In one embodiment, a silicide block 170 is provided. The silicide block prevents formation of metal silicide contacts over crystalline or silicon material during a subsequent silicide process. The silicide block, for example, is formed of a dielectric material. Other types of materials which prevent silicidation may also be useful. The silicide block includes material having good etch selectivity with, for example, STI, sidewall spacer and substrate. In one embodiment, the silicide block is formed of silicon nitride. The silicide block may be about 50 nm thick. Other suitable thicknesses may also be useful.

The silicide block, in one embodiment, prevents formation of silicide at least at the interface of the STI region and the S/D region which is subjected to high voltages adjacent to the gate. For example, the silicide block prevents formation of silicide at about the interface of the STI region and the first S/D region (or drain) adjacent to the gate. For example, the silicide block prevents formation of silicide at the isolation edge or STI edge adjacent to the gate. To ensure that the STI edge of the STI region adjacent to the gate is covered by the silicide block, the silicide block is configured to overlap the gate and the interface of the first S/D region and STI region adjacent to the gate.

In one embodiment, the silicide block 170 covers the first S/D region $140_1$, including the STI edge adjacent to the gate.

As shown in FIGS. 1a-1b, the silicide block covers the complete surface of the first S/D region $140_1$ from the gate (or spacer) to the STI edge. To ensure that the STI edge of the STI region adjacent to the gate is covered by the silicide block, the silicide block is configured to cover and overlap beyond the first S/D region into the STI region and the gate. For example, the silicide block overlaps an edge portion of the gate which is adjacent to the first S/D (or drain) side, covers the surface of the first S/D region and overlaps a portion of the STI region adjacent to the first S/D region as shown in FIGS. 1a-1b. Other suitable configurations of the silicide block which prevent formation of silicide at least at the STI edge adjacent to the gate may also be useful. For example, the silicide block may include multiple silicide blocks to prevent formation of silicide at least at the interface of the STI region and the S/D region which is subjected to high voltages adjacent to the gate.

Metal silicide contacts 175 are disposed over exposed crystalline or silicon material, such as the terminals or contact regions of the transistor exposed by the silicide block. For example, metal silicide contacts are disposed over the second S/D region $140_2$ and exposed portions of the gate electrode 136. The metal silicide contacts, for example, may be nickel-based contacts. Other types of metal silicide contacts may also be useful. For example, the metal silicide contact may be cobalt silicide ($CoSi_2$) or nickel silicide (NiSi). The metal silicide contacts may be about 50-300 Å thick. Other thicknesses may also be useful.

A dielectric layer is disposed over the substrate. The dielectric layer, for example, serves as a pre-metal dielectric (PMD) layer 190. The dielectric layer, for example, may be a silicon oxide layer. Other types of dielectric layers which may serve as a PMD layer may also be used.

Via contacts 195, such as tungsten contacts, may be disposed in the PMD layer 190. The contacts are disposed in the PMD layer, in communication with the terminals or contact regions of the transistor 110. A dielectric etch stop layer (not shown) may be provided on the substrate. The etch stop layer is disposed between the substrate, including the transistor, and the PMD layer. The etch stop layer, for example, is a silicon nitride etch stop layer. Other types of etch stop layers may also be useful. The etch stop layer should have a material which can be selectively removed from a dielectric layer thereover. The etch stop layer facilitates in forming via contacts or contact plugs to contact regions of the transistor, such as the gate electrode and doped regions or S/D regions, in the PMD layer. In some embodiments, the etch stop layer may also serve as a stress layer for applying a stress on the channel of the transistor to improve performance.

As described, the transistor includes a silicide block 170 disposed on the HV transistor which protects silicidation at the STI edge on a high voltage side (e.g., drain side $140_1$) of the transistor adjacent the gate while the S/D region on the low voltage side (e.g., source side $140_2$) is exposed for silicidation. The silicide block extends beyond the STI edge interfacing the drain region as well as over the gate. The silicide block prevents unwanted encroachment of silicide under the gate between the gate and S/D region near the STI region. This improves BV spread of transistors. Since the silicide block is only provided at the STI edge of the first S/D region or drain, this produces an asymmetrical configuration of the transistor.

Figure 2A:
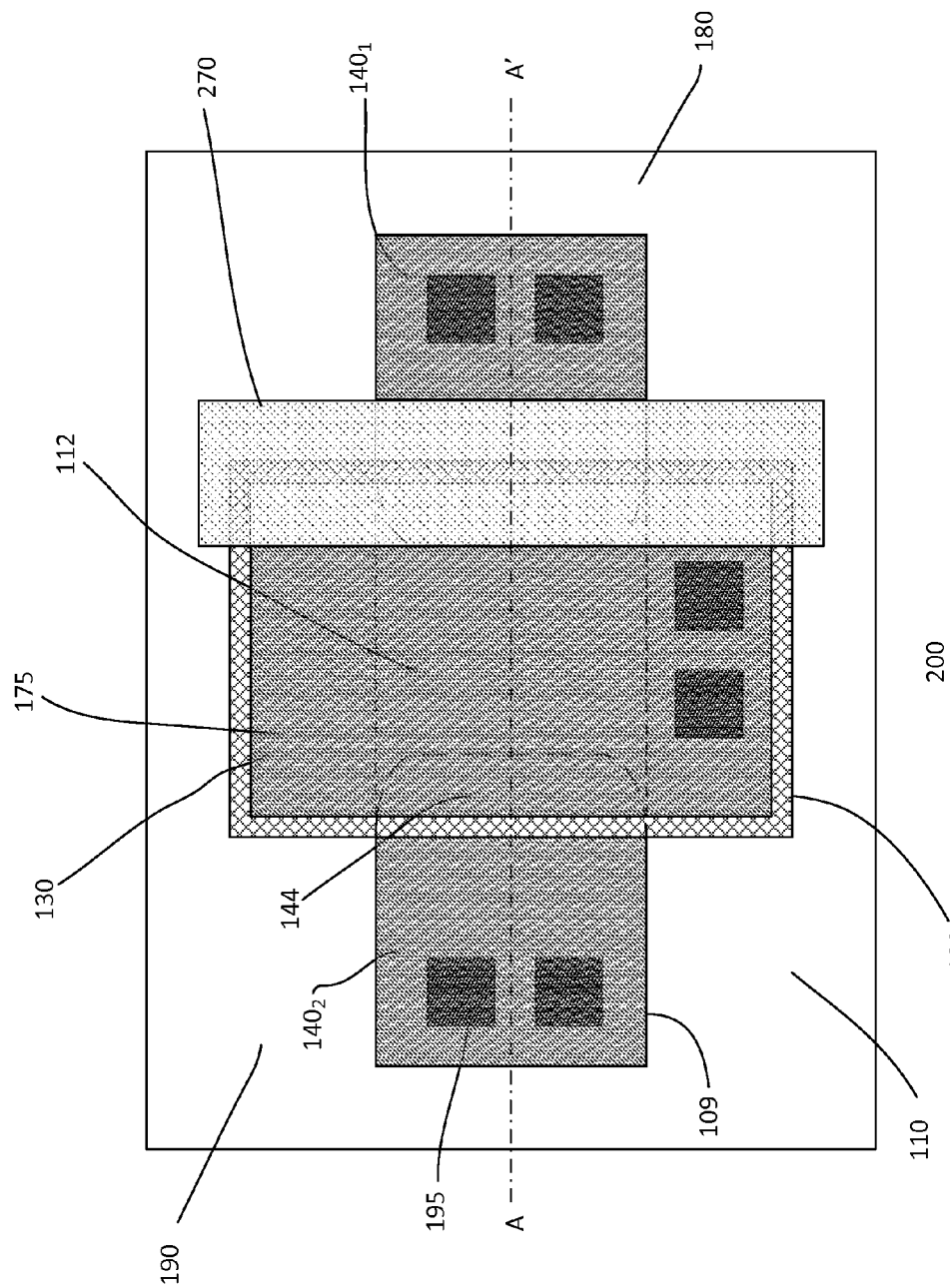
FIGS. 2a-2b show top and cross-sectional views of another embodiment of a device.
Figure 2B:
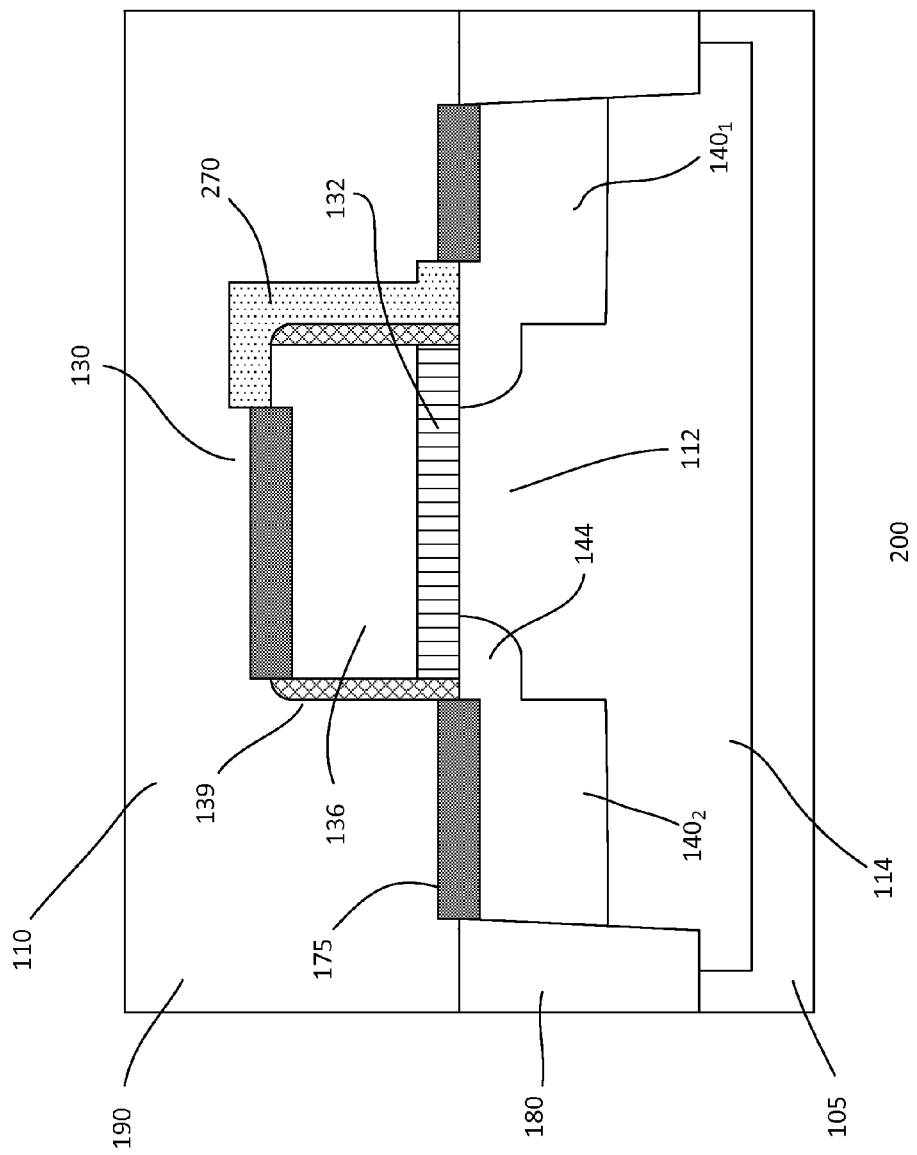

FIGS. 2a-2b show top and cross-sectional views of another embodiment of a device 200. The cross-sectional view is taken along A-A' in the channel length direction of the device. The device, for example, is an IC. Other types of devices may also be useful. The device is similar to that described in FIGS. 1a-1b. Common elements and features having the same reference numerals may not be described or described in detail. The silicide block 270 is disposed on the drain side $140_1$ of the transistor S/D regions.

The silicide block 270 is a single silicide block covering the STI edge in the first S/D or drain region $140_1$ adjacent to the gate. As shown, the silicide block 270 covers a portion of the first S/D region, including the STI edge adjacent and proximate to the gate while a distal portion of the first S/D region from the gate is exposed. For example, the silicide block 270 overlaps an edge portion of the gate which is adjacent to the first S/D (or drain) side, covers a portion of the first S/D region as well as the STI edge and a portion of the STI region adjacent to and proximate the gate as shown FIGS. 2a-2b. This configuration also improves BV spread of the transistor. Exposing a distal portion of the first S/D region enables formation of silicide contact on the exposed portion, reducing contact resistance. Since the silicide block is only provided at the STI edge of the first S/D region or drain, this produces an asymmetrical configuration of the transistor.

Figure 3A:
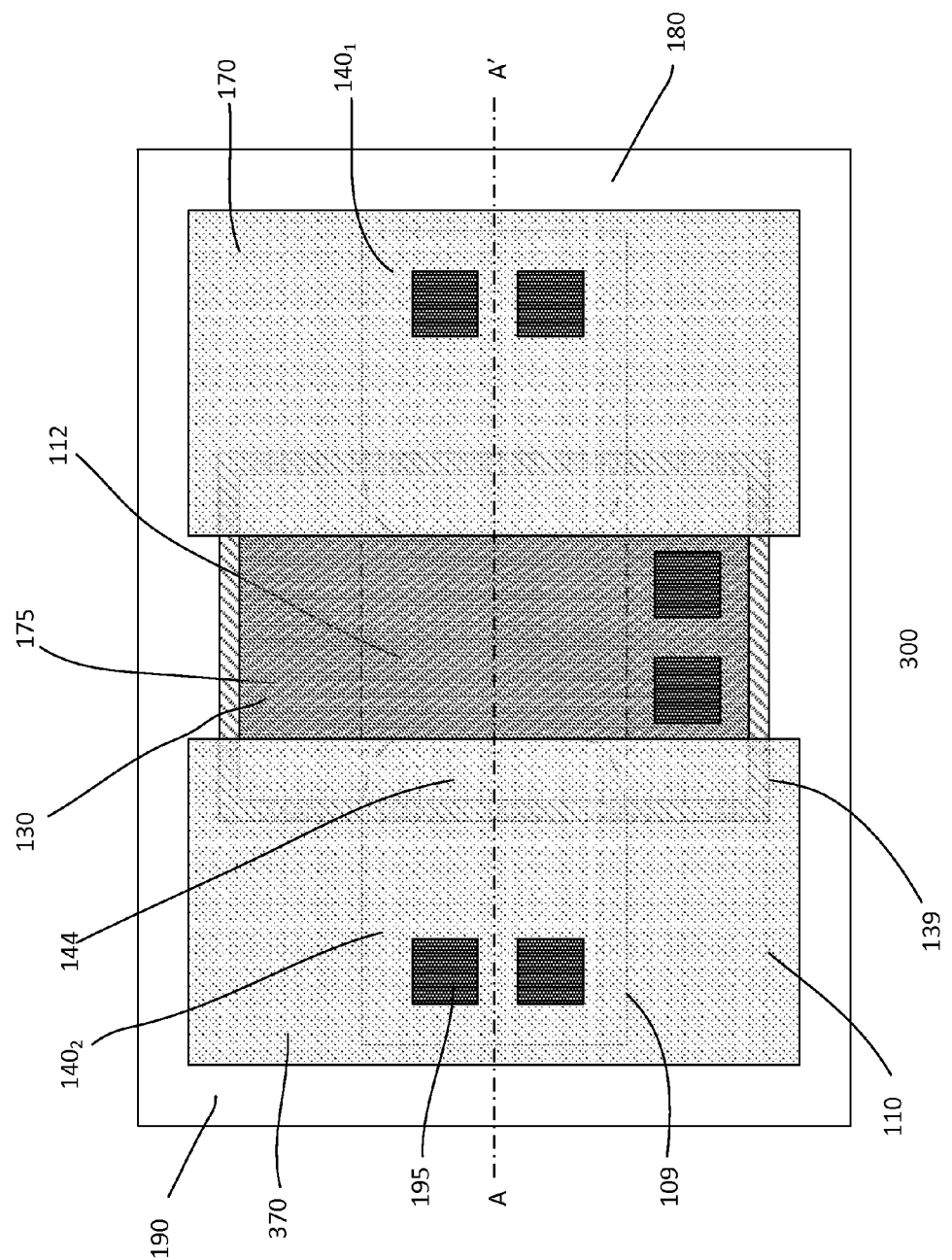
FIGS. 3a-3b show top and cross-sectional views of yet another embodiment of a device.
Figure 3B:
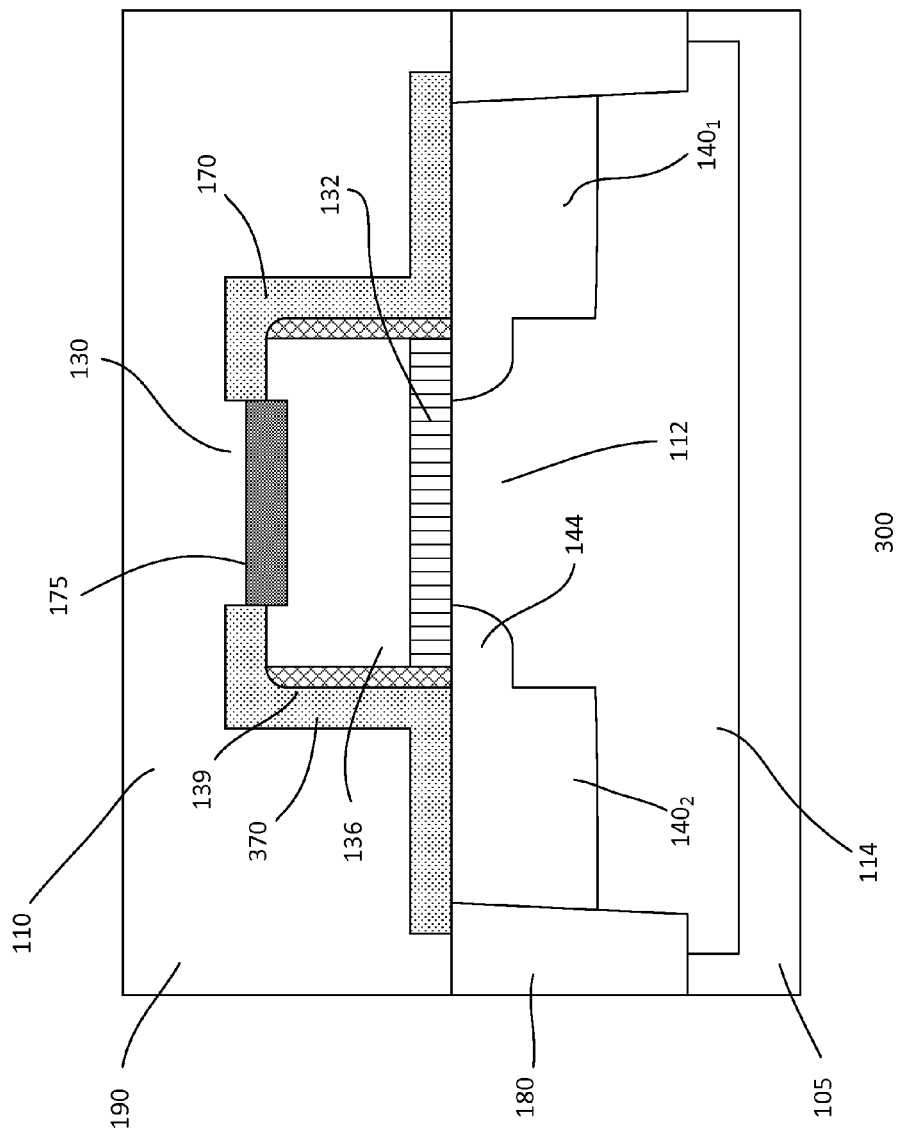

FIGS. 3a-3b show top and cross-sectional views of yet another embodiment of a device 300. The cross-sectional view is taken along A-A' in the channel length direction of the device. The device, for example, is an IC. Other types of devices may also be useful. The device is similar to that described in FIGS. 1a-1b. Common elements may not be described or described in detail. As shown, first and second silicide blocks 170 and 370 are disposed on both the drain $140_1$ and source $140_2$ regions of the transistor S/D regions. This produces a symmetrical transistor.

In one embodiment, the silicide blocks 170 and 370 cover the first and second S/D regions, including the STI edges adjacent to the gate. As shown, the silicide blocks cover the complete surface of the first and second S/D regions from the gate (or spacer) to the STI edges. For example, the silicide blocks are configured to cover and overlap beyond the S/D regions into the STI region and the gate. For example, the silicide block 170 overlaps an edge portion of the gate which is adjacent to the first S/D (or drain) side, covers the surface of the first S/D region $140_1$ and overlaps a portion of the STI region adjacent to the first S/D region. The silicide block 370, for example, overlaps an edge portion of the gate which is adjacent to the second S/D (or source) side, covers the surface of the second S/D region $140_2$ and overlaps a portion of the STI region adjacent to the second S/D region. Other configurations of the silicide blocks which prevent formation of silicide at the STI edges adjacent to the gate may also be useful.

Figure 4A:
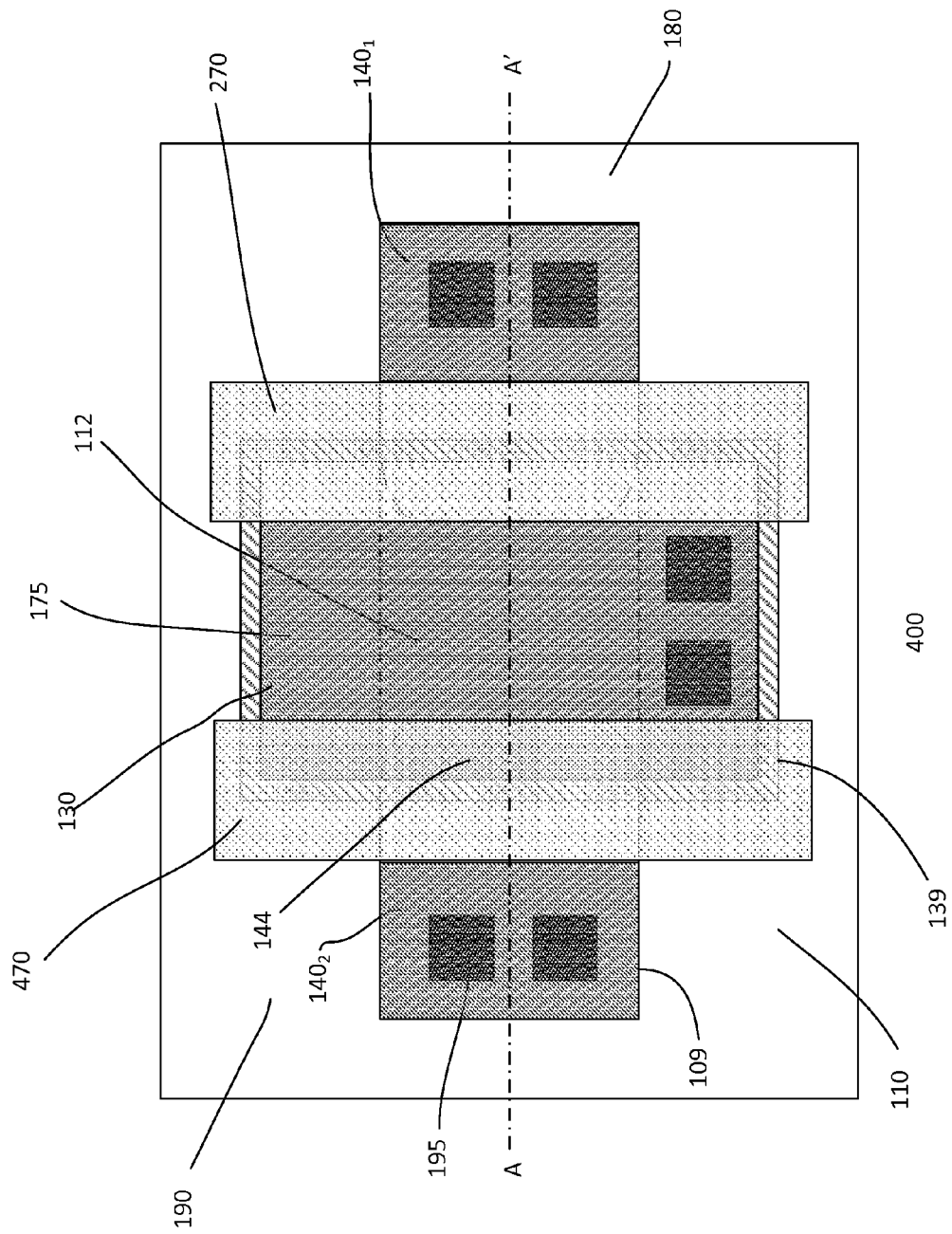
FIGS. 4a-4b show top and cross-sectional views of another embodiment of a device.
Figure 4B:
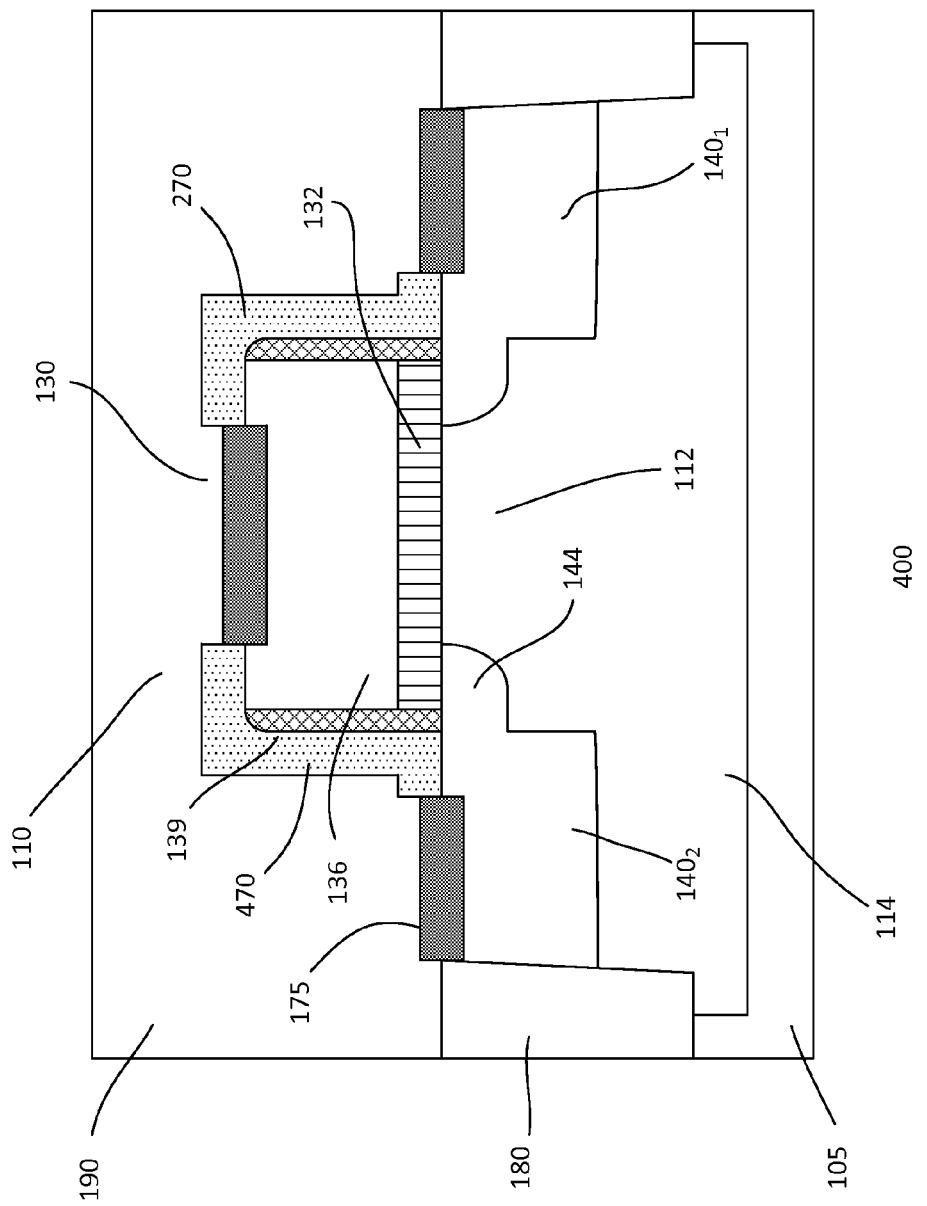

FIGS. 4a-4b show top and cross-sectional views of another embodiment of a device 400. The cross-sectional view is taken along A-A' in the channel length direction of the device. The device, for example, is an IC. Other types of devices may also be useful. The device is similar to that described in FIGS. 1a-1b and 2a-2b. Common elements may not be described or described in detail. As shown, first and second silicide blocks 270 and 470 are disposed on the drain and source $140_1$-$140_2$ regions of the transistor S/D regions. This produces a symmetrical transistor.

In one embodiment, the silicide blocks 270 and 470 are single silicide blocks covering the STI edges in the first and second S/D regions adjacent to the gate. As shown, the silicide blocks 270 and 470 cover a portion of the S/D regions, including the STI edges adjacent and proximate to the gate while distal portions of the first and second S/D regions from the gate are exposed. For example, the silicide block 270 overlaps an edge portion of the gate which is adjacent to the first S/D (or drain) side, covers a portion of the first S/D region $140_1$ as well as the STI edge and a portion of the STI region adjacent to and proximate the gate. The silicide block 470, for example, overlaps an edge portion of the gate which is adjacent to the second S/D (or source) side, covers a portion of the second S/D region $140_2$ as well as the STI edge and a portion of the STI region adjacent to and proximate the gate. Exposing distal portions of the S/D regions enables formation of silicide contacts on the exposed portions, reducing contact resistance.

Figure 5A:
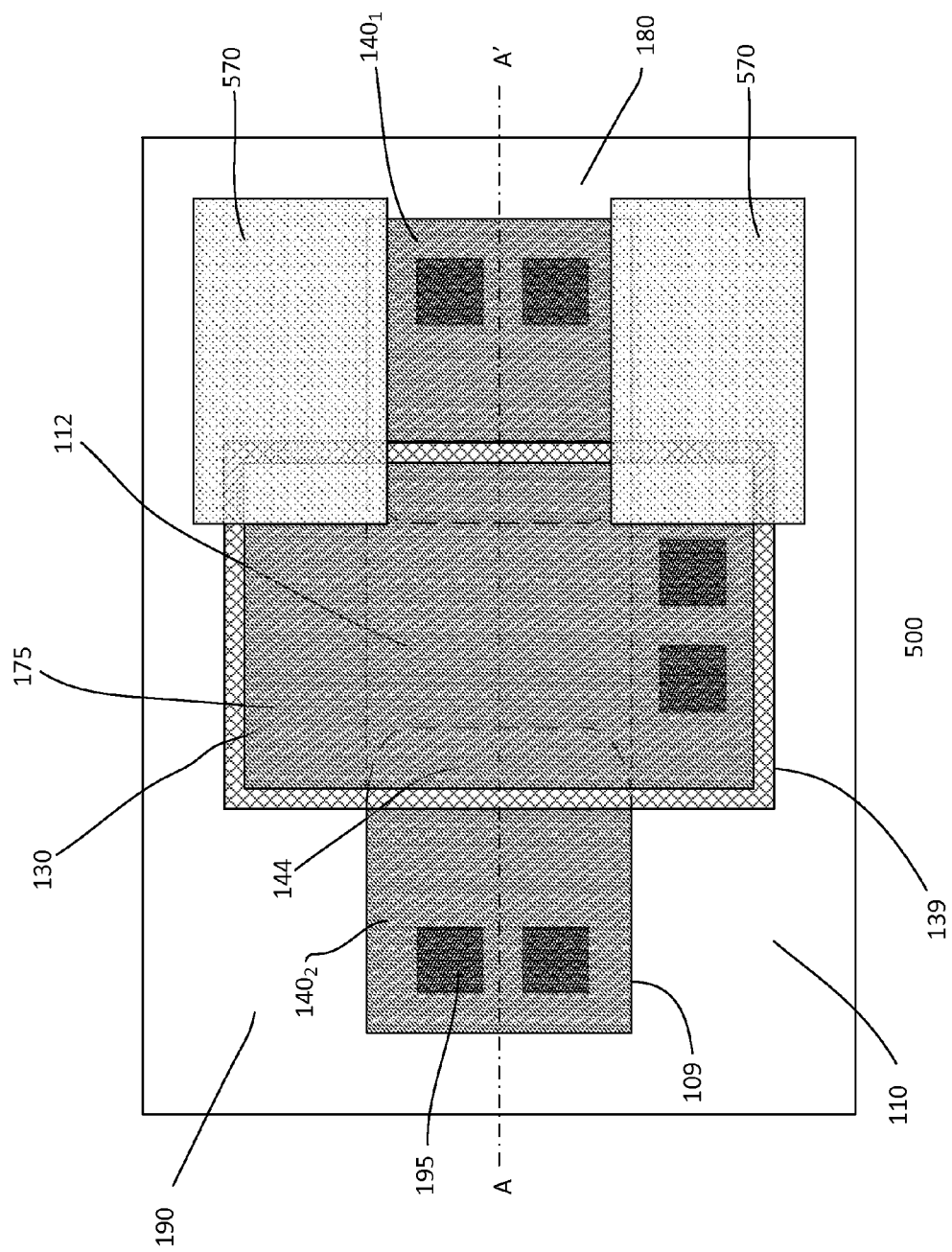
FIGS. 5a-5b show top and cross-sectional views of another embodiment of a device.
Figure 5B:
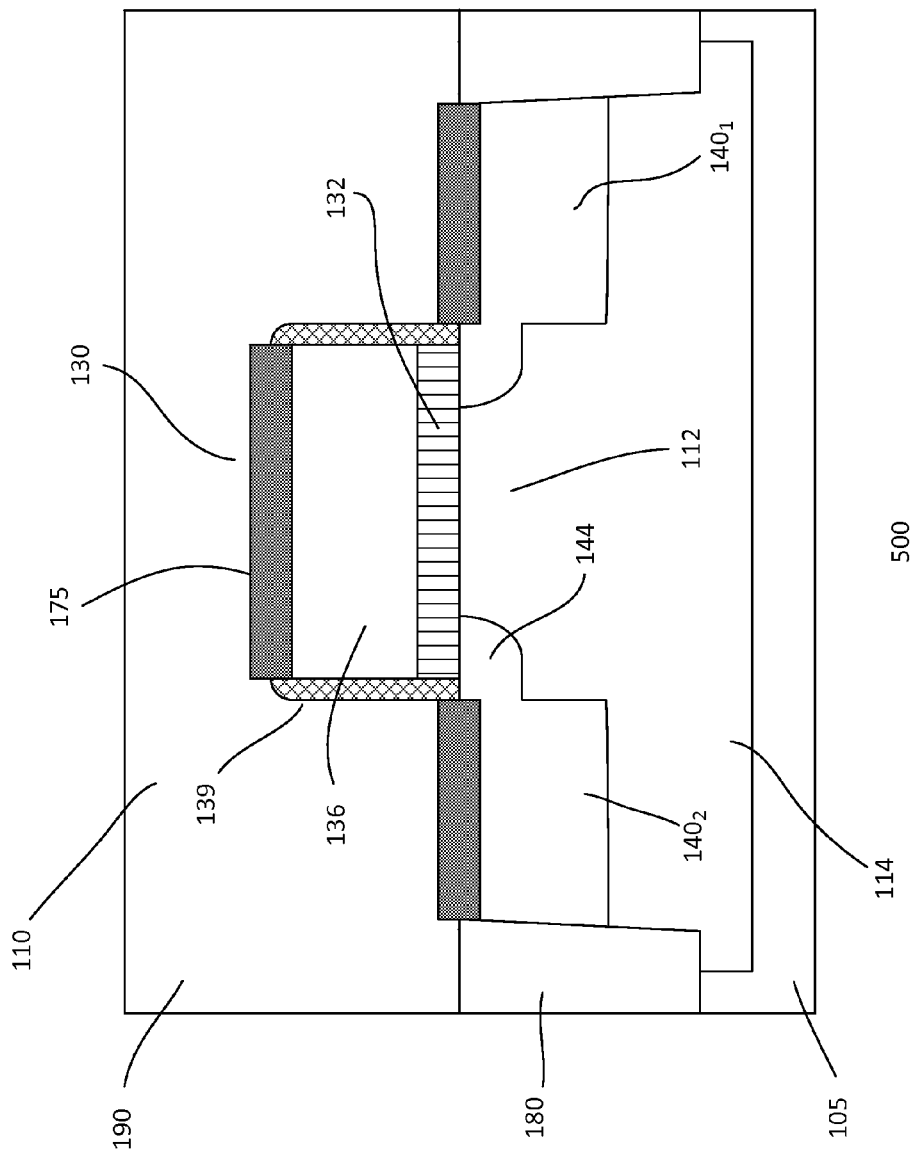

FIGS. 5*a*-5*b* show top and cross-sectional views of another embodiment of a device 500. The cross-sectional view is taken along A-A' in the channel length direction of the device. The device, for example, is an IC. Other types of devices may also be useful. The device is similar to that described in FIGS. 1*a*-1*b*. Common elements may not be described or described in detail.

In one embodiment, a silicide block is disposed on the S/D region subjected to high voltages (e.g., drain side $140_1$). In one embodiment, the silicide block includes first and second silicide sub-blocks 570. A silicide sub-block covers a STI edge abutting the first S/D region along the channel length direction. This prevents the STI edges along the channel length direction abutting the first S/D region from silicidation. To ensure that the STI edges along the channel length direction are not silicided, a silicide sub-block extends to a portion of the gate and an edge portion of the STI region. For example, a silicide sub-block 570 overlaps a portion of an edge portion of the gate which is adjacent to the first S/D (or drain) side, covers the STI edge abutting the first S/D region and overlaps a portion of the STI region adjacent to the first S/D region. The silicide sub-blocks 570 leave a central portion of the first S/D region $140_1$ exposed for silicidation. Since the silicide sub-block are only provided on the first transistor S/D region or drain, it produces an asymmetrical configuration of the transistor.

Figure 6A:
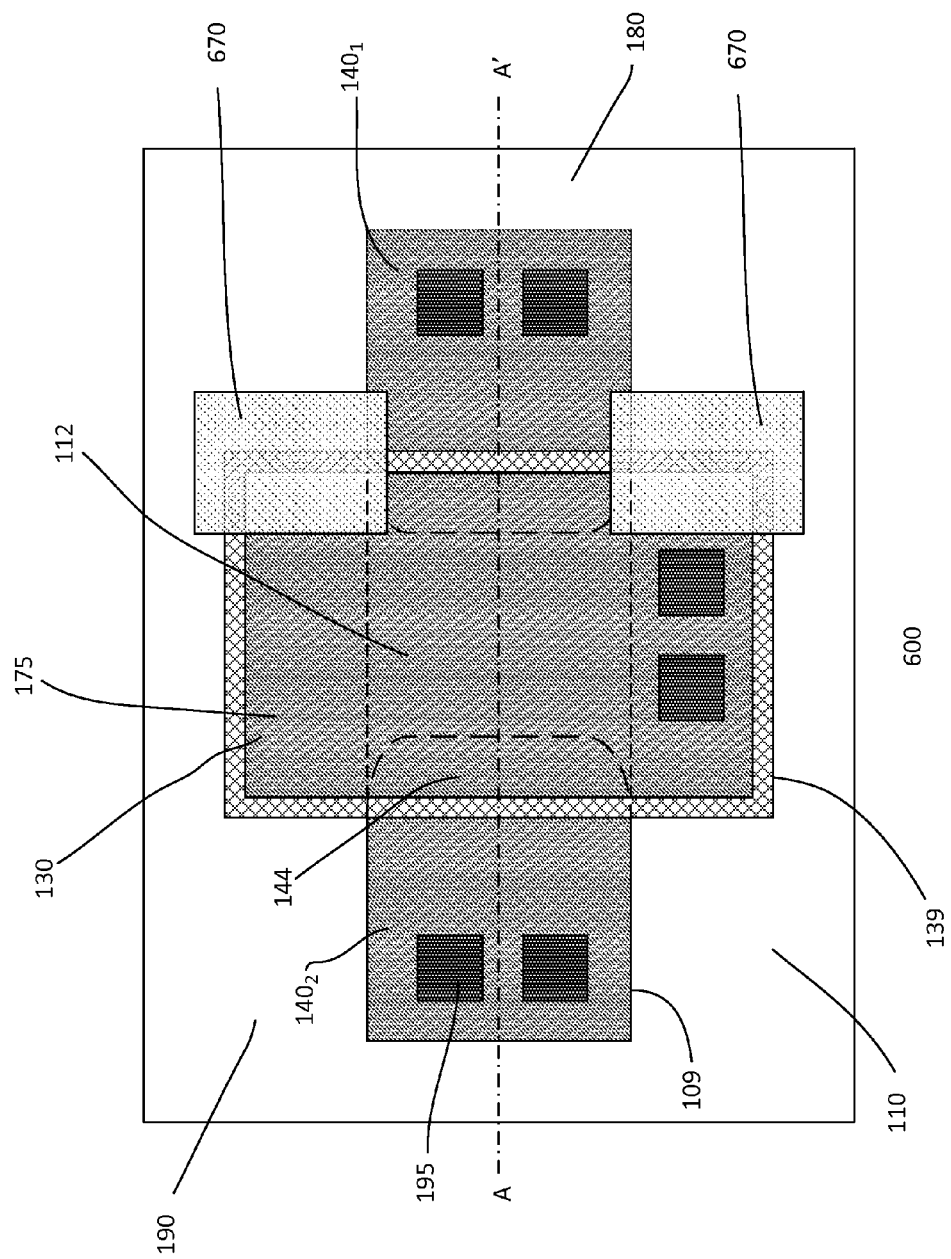
FIGS. 6a-6b show top and cross-sectional views of another embodiment of a device.
Figure 6B:
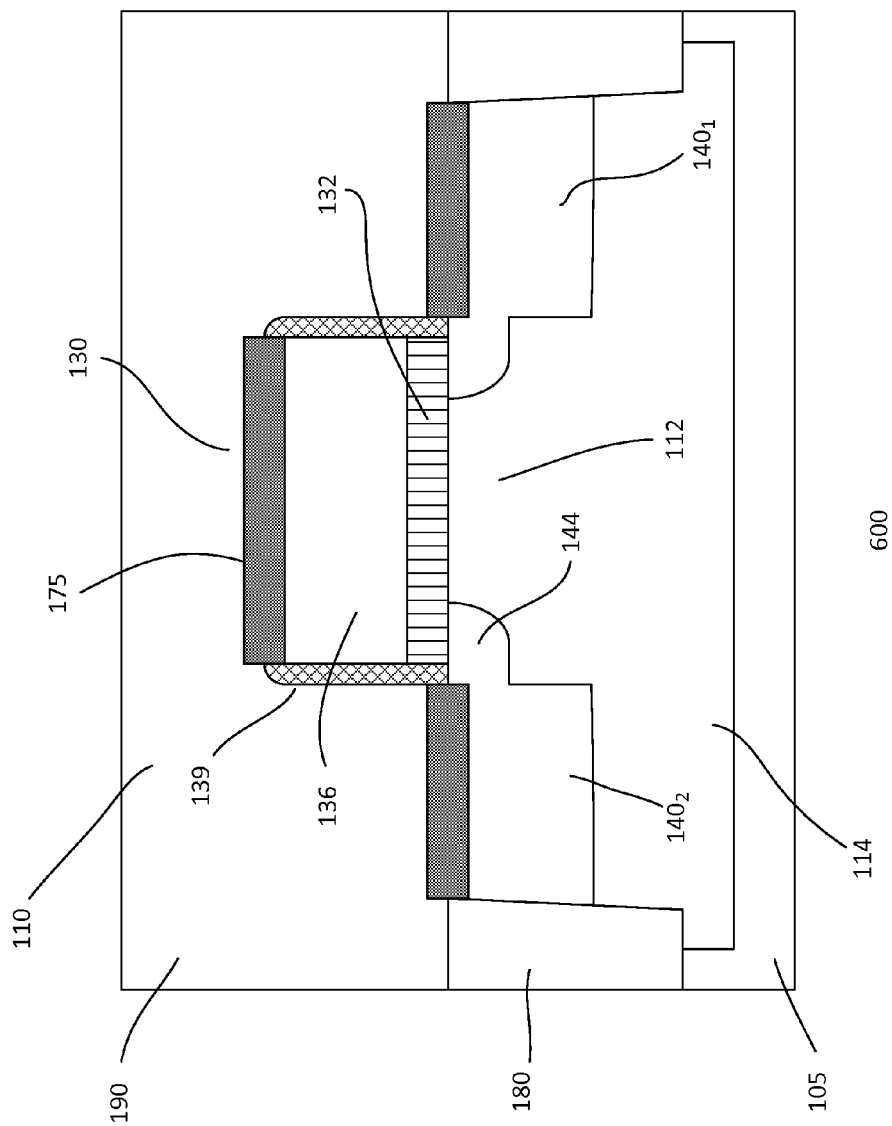

FIGS. 6*a*-6*b* show top and cross-sectional views of another embodiment of a device 600. The cross-sectional view is taken along A-A' in the channel length direction of the device. The device, for example, is an IC. Other types of devices may also be useful. The device is similar to that described in FIGS. 2*a*-2*b*. Common elements may not be described or described in detail.

Referring to FIGS. 6*a*-6*b*, the silicide block includes first and second silicide sub-blocks 670. A silicide sub-block covers a STI edge abutting the first S/D region along the channel length direction adjacent to the gate. A portion of the STI edge along the channel length direction distal from the gate and a central portion of the first S/D region are exposed. This prevents the STI edges adjacent and proximate to the gate in the first S/D region from silicidation. To ensure that the STI edges adjacent to the gate are not silicided, a silicide sub-block extends to a portion of the gate and an edge portion of the STI region. For example, a silicide sub-block 670 overlaps a portion of an edge portion of the gate which is adjacent to the first S/D (or drain) side, covers STI edges adjacent and proximate to the gate in the first S/D region and a portion of the STI region adjacent to and proximate the gate. The silicide sub-blocks 670 leave a central portion of the first S/D region as well as a portion of the first S/D region distal from the gate exposed for silicidation. Since the silicide sub-block is only provided on the first S/D region or drain, it produces an asymmetrical configuration of the transistor.

Figure 7A:
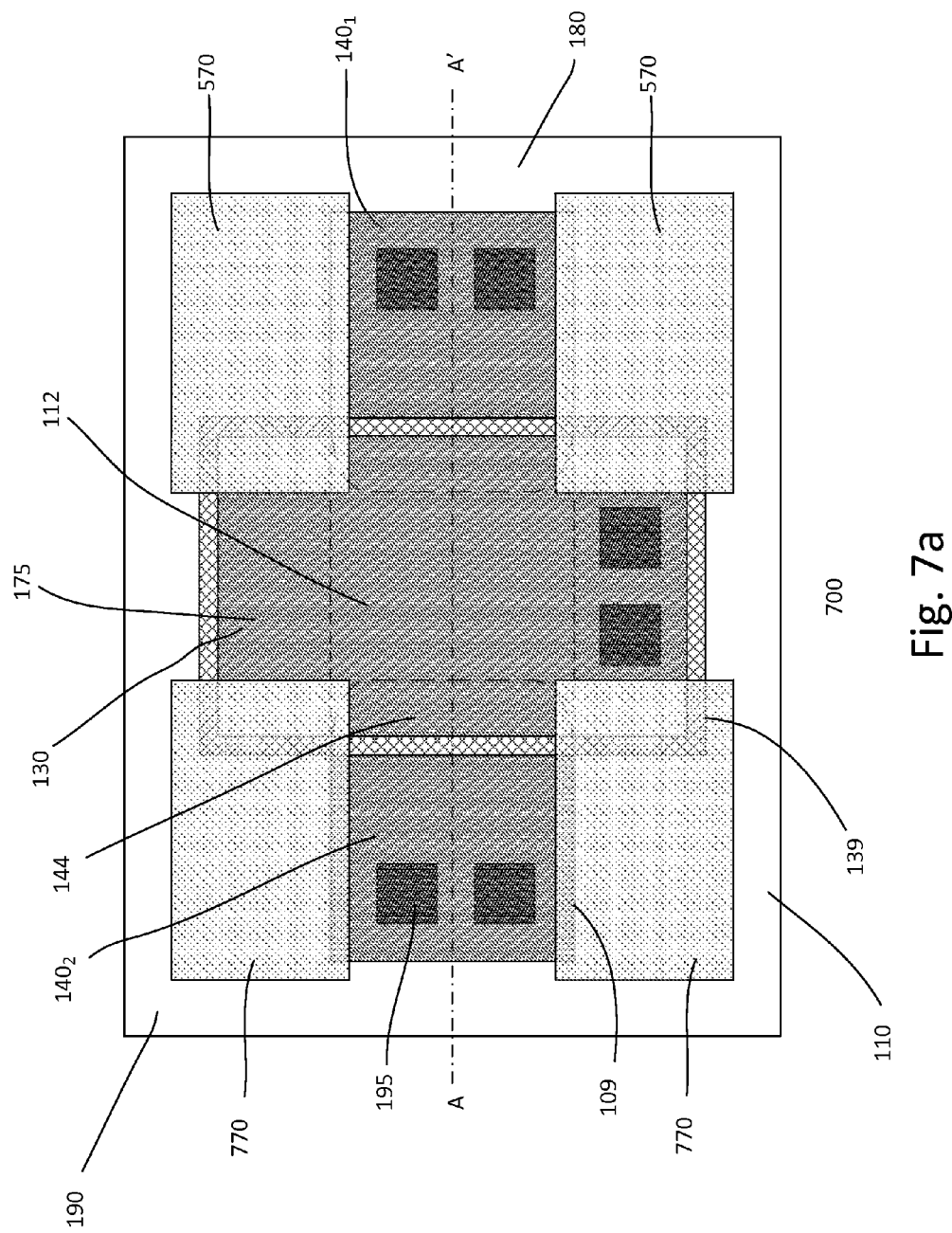
FIGS. 7a-7b show top and cross-sectional views of another embodiment of a device.
Figure 7B:
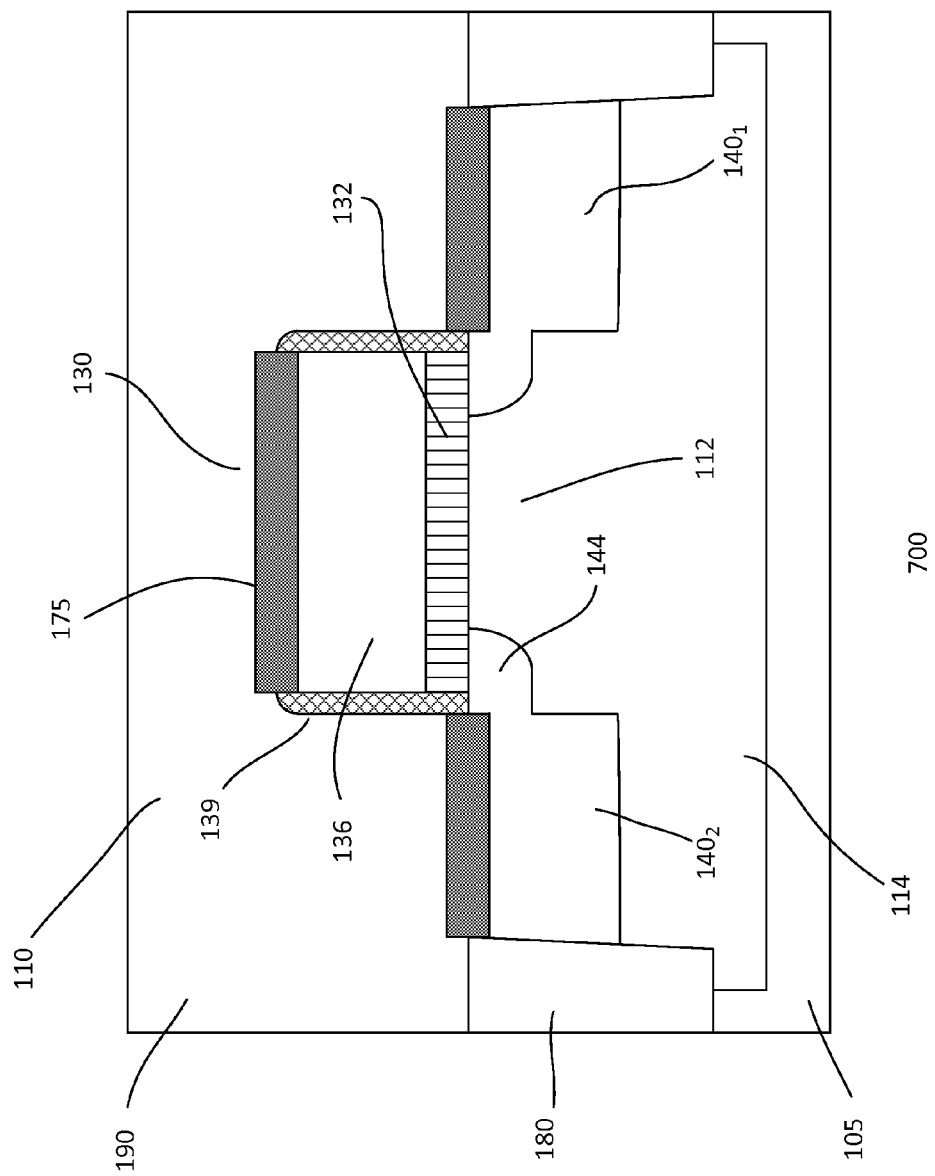

FIGS. 7*a*-7*b* show top and cross-sectional views of another embodiment of a device 700. The cross-sectional view is taken along A-A' in the channel length direction of the device. The device, for example, is an IC. Other types of devices may also be useful. The device is similar to that described in FIGS. 5*a*-5*b*. Common elements may not be described or described in detail.

In one embodiment, the silicide block includes first and second silicide sub-blocks 570 over the first transistor S/D region $140_1$ and first and second silicide sub-blocks 770 over the second transistor S/D region $140_2$. A silicide sub-block covers a STI edge abutting a transistor S/D region along the channel length direction. This prevents the STI edges along the channel length direction abutting the S/D regions from silicidation. To ensure that the STI edges along the channel length direction are not silicided, the silicide sub-blocks extend to a portion of the gate and an edge portion of the STI region. For example, a silicide sub-block 570 overlaps a portion of an edge portion of the gate which is adjacent to the first S/D (or drain) side, covers the STI edge abutting the first S/D region $140_1$ and overlaps a portion of the STI region adjacent to the first S/D region. A silicide sub-block 770, for example, overlaps a portion of an edge portion of the gate which is adjacent to the second S/D (or source) side, covers the STI edge abutting the second S/D region $140_2$ and overlaps a portion of the STI region adjacent to the second S/D region. The silicide sub-blocks 570 and 770 leave a central portion of the first and second S/D regions exposed for silicidation. Since the silicide sub-blocks are provided on both transistor S/D regions $140_1$ and $140_2$, this produces a symmetrical configuration of the transistor.

Figure 8A:
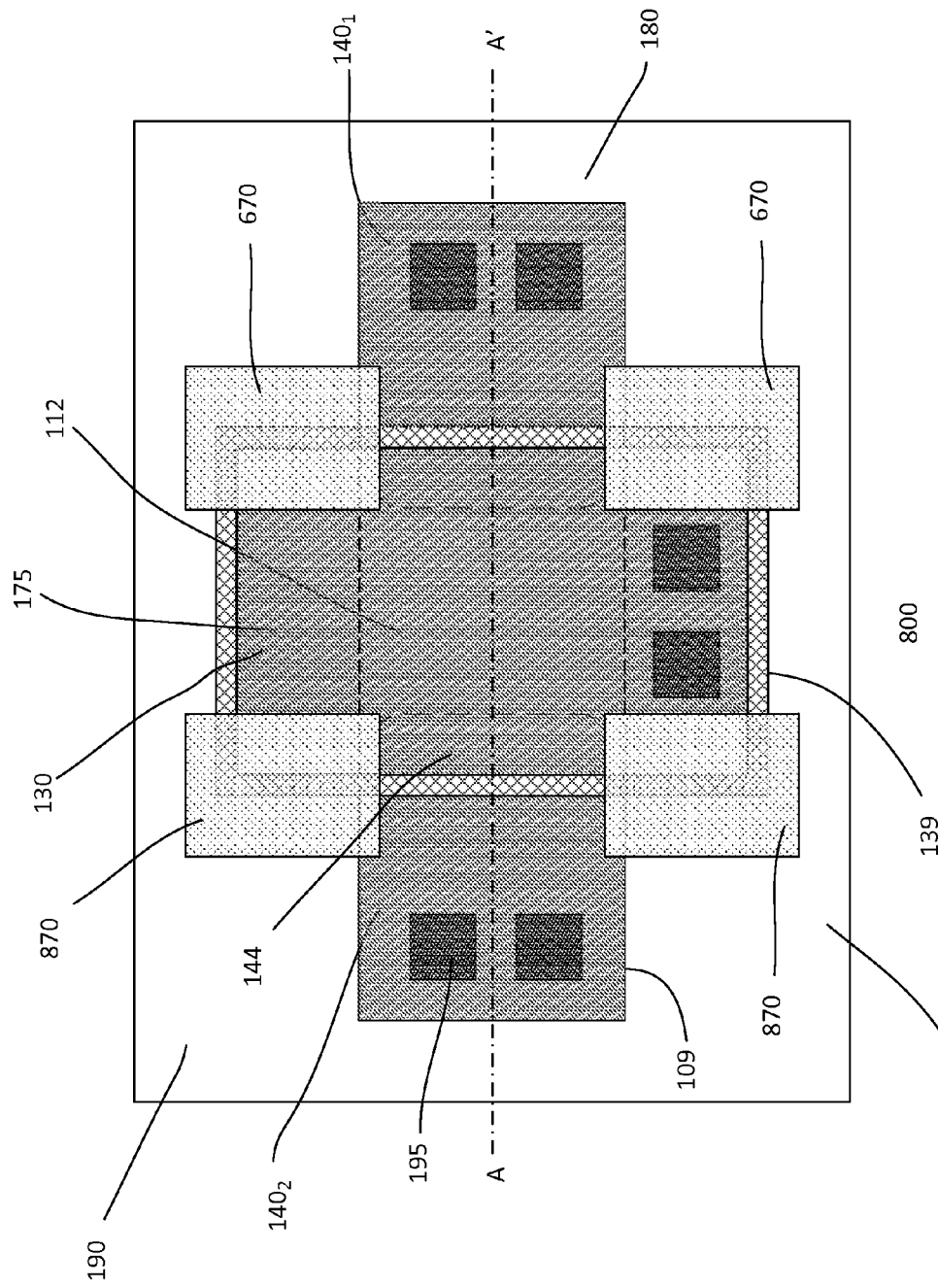
FIGS. 8a-8b show top and cross-sectional views of another embodiment of a device.
Figure 8B:
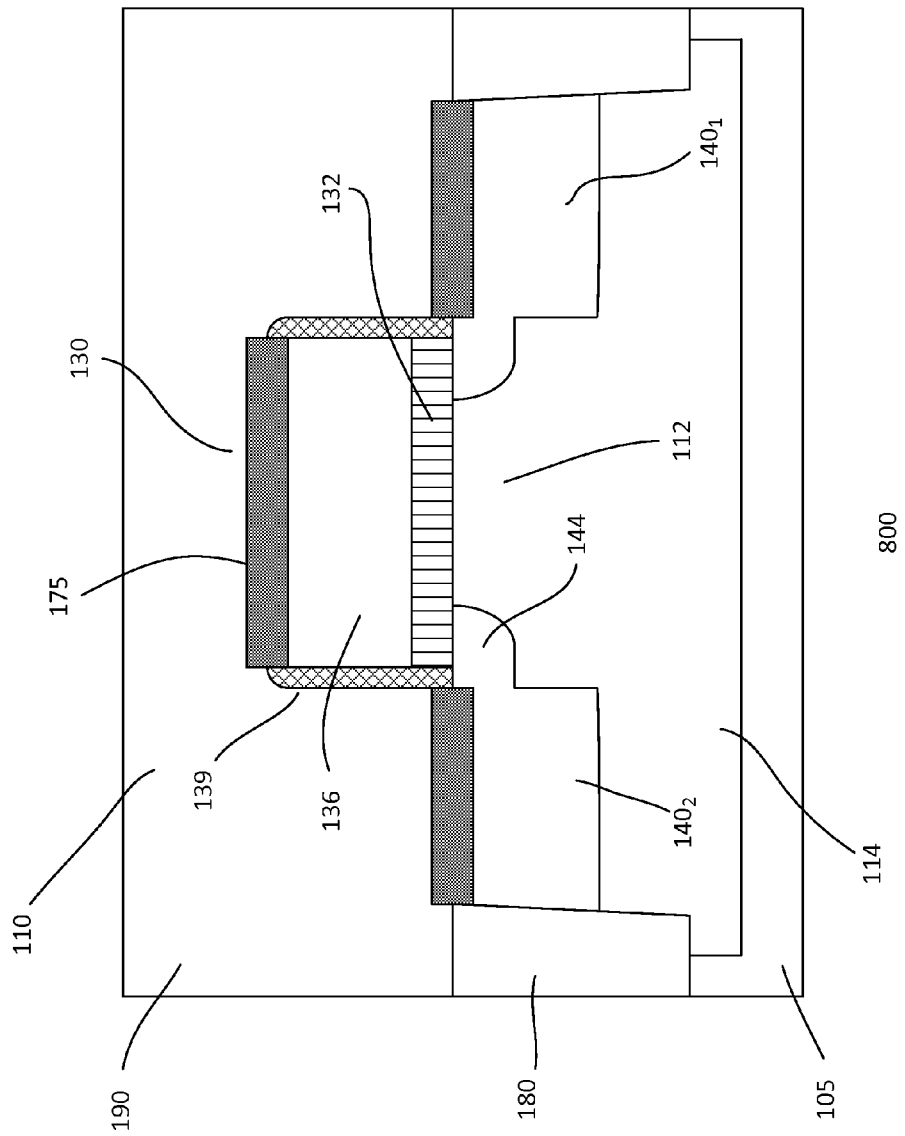

FIGS. 8*a*-8*b* show top and cross-sectional views of another embodiment of a device 800. The cross-sectional view is taken along A-A' in the channel length direction of the device. The device, for example, is an IC. Other types of devices may also be useful. The device is similar to that described in FIGS. 6*a*-6*b*. Common elements may not be described or described in detail.

In one embodiment, the silicide block includes first and second silicide sub-blocks 670 over the first transistor S/D region $140_1$ and first and second silicide sub-blocks 870 over the second transistor S/D region $140_2$. A silicide sub-block covers a STI edge abutting a transistor S/D region along the channel length direction adjacent to the gate. A portion of the STI edges along the channel length direction distal from the gate and a central portion of the first and second S/D regions are exposed. This prevents the STI edges adjacent and proximate to the gate in the S/D regions from silicidation. To ensure that the STI edges adjacent to the gate are not silicided, a silicide sub-block extends to a portion of the gate and an edge portion of the STI region. For example, a silicide sub-block 670 overlaps a portion of an edge portion of the gate which is adjacent to the first S/D (or drain) side, covers STI edges adjacent and proximate to the gate in the first S/D region $140_1$ and a portion of the STI region adjacent to and proximate the gate. A silicide sub-block 870, for example, overlaps a portion of an edge portion of the gate which is adjacent to the second S/D (or source) side, covers STI edges adjacent and proximate to the gate in the second S/D region $140_2$ and a portion of the STI region adjacent to and proximate the gate. The silicide sub-blocks 670 and 870 leave a central portion of the first and second S/D regions as well as a portion of the S/D regions distal from the gate exposed for silicidation. Since the silicide sub-blocks are provided on both transistor S/D regions $140_1$ and $140_2$, this produces a symmetrical configuration of the transistor.

Figure 9A:
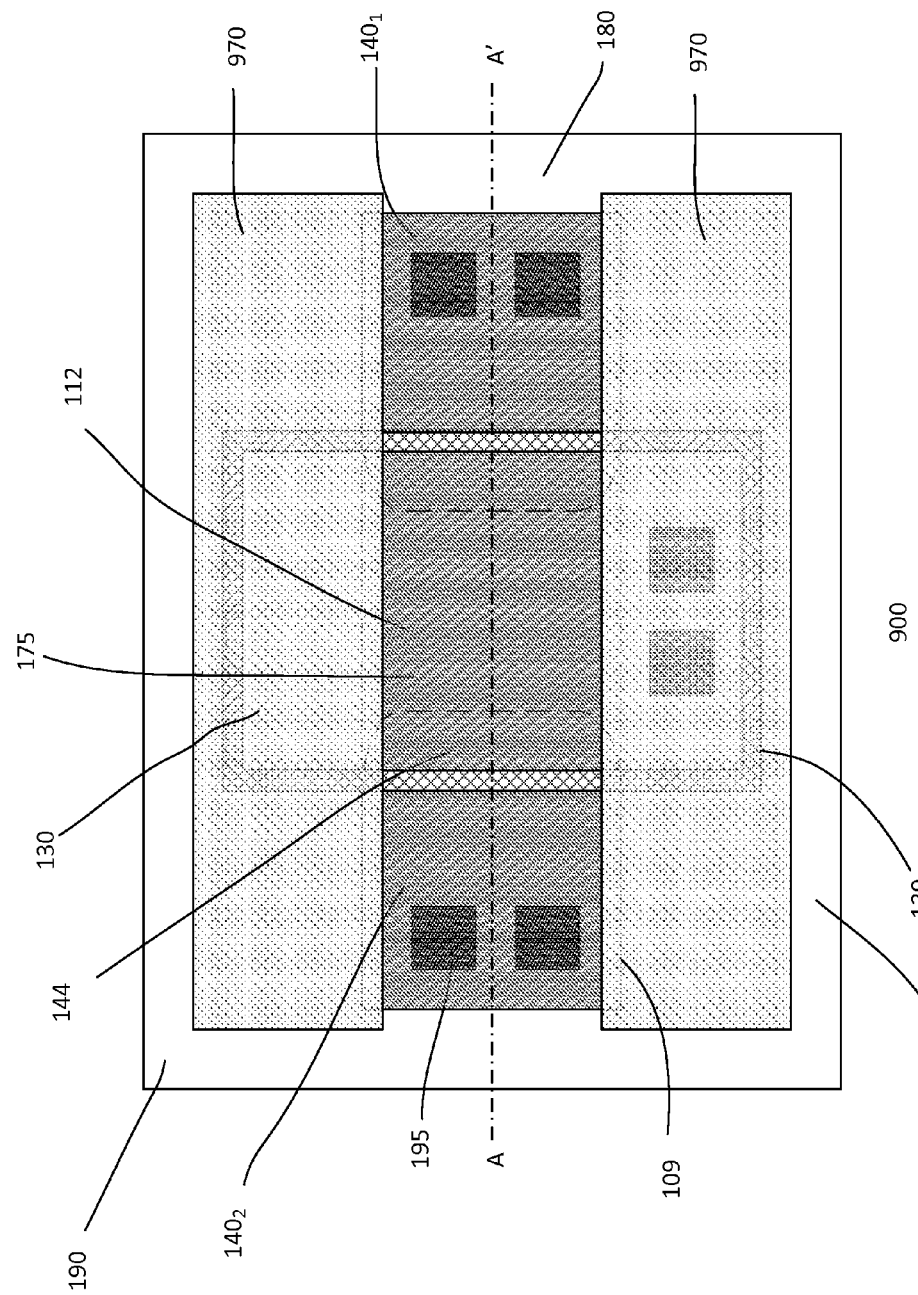
FIGS. 9a-9b show top and cross-sectional views of another embodiment of a device.
Figure 9B:
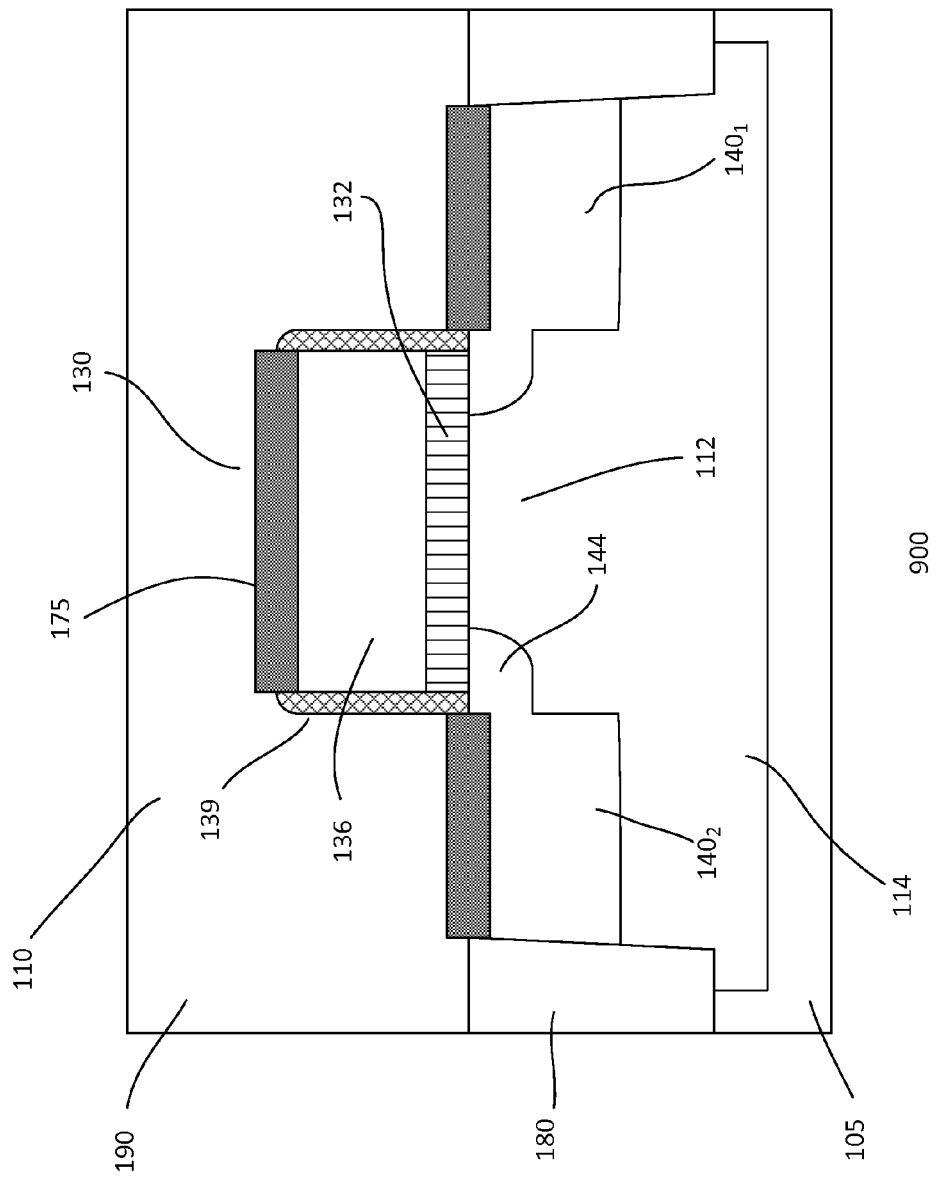

FIGS. 9*a*-9*b* show top and cross-sectional views of another embodiment of a device 900. The cross-sectional view is taken along A-A' in the channel length direction of the device. The device, for example, is an IC. Other types of devices may also be useful. The device is similar to that described in FIGS. 7a-7b. Common elements may not be described or described in detail.

In one embodiment, the silicide sub-blocks 970 are disposed over both first and second transistor S/D regions $140_1$ and $140_2$. As shown, a silicide sub-block extends across the transistor gate 130. In one embodiment, the silicide sub-blocks 970 leave a central portion of the S/D regions exposed for silicidation. For example, the silicide sub-blocks 970 leave a central portion of the S/D regions and a central portion of the gate exposed for silicidation. Since the silicide sub-blocks are provided on both the first and second transistor S/D regions, this produces a symmetrical configuration of the transistor.

Figure 10A:
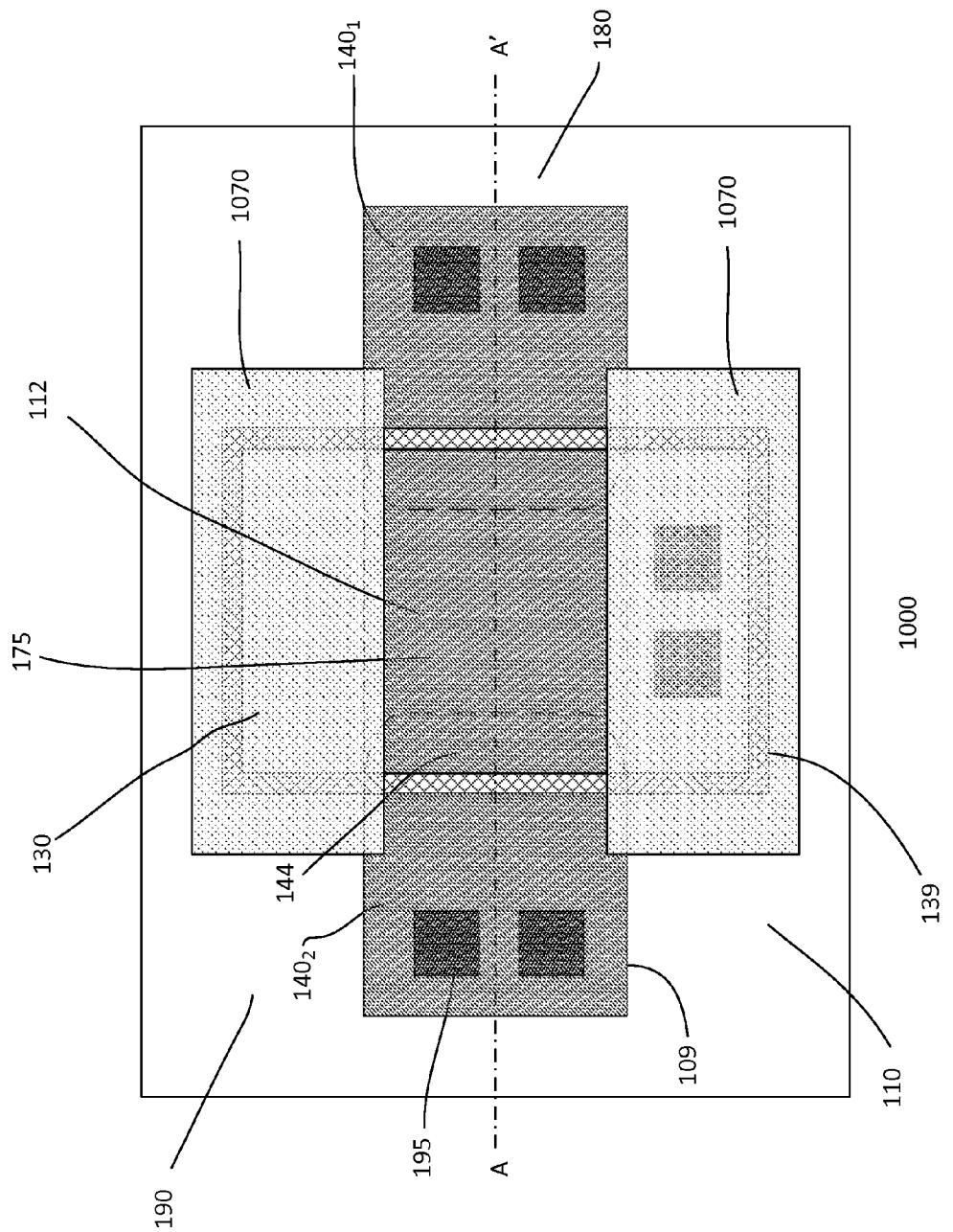
FIGS. 10a-10b show top and cross-sectional views of another embodiment of a device.
Figure 10B:
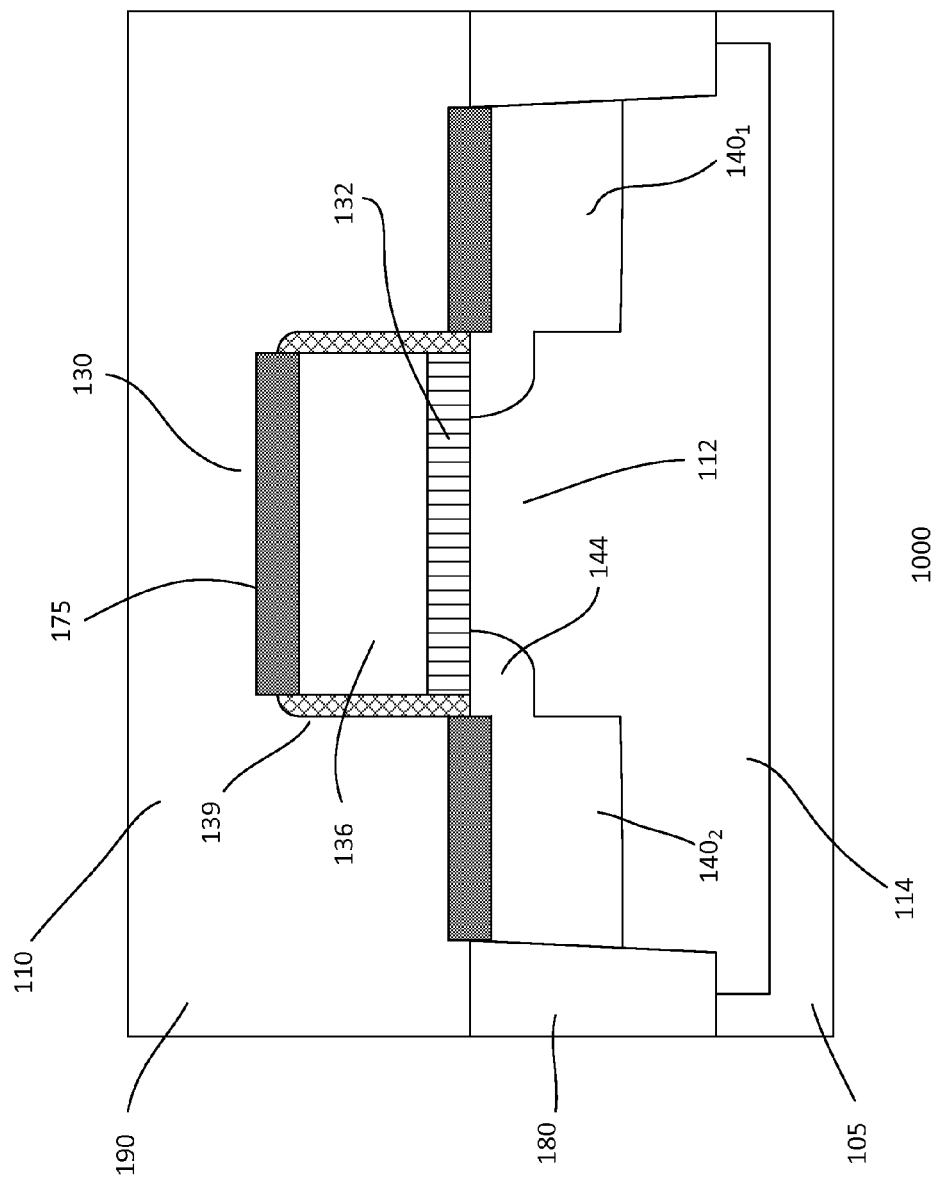

FIGS. 10a-10b show top and cross-sectional views of another embodiment of a device 1000. The cross-sectional view is taken along A-A' in the channel length direction of the device. The device, for example, is an IC. Other types of devices may also be useful. The device is similar to that described in FIGS. 8a-8b. Common elements may not be described or described in detail.

In one embodiment, the silicide sub-blocks 1070 are disposed over both first and second transistor S/D regions $140_1$ and $140_2$. As shown, a silicide sub-block extends across the transistor gate 130. In one embodiment, the silicide sub-blocks leave a central portion of the gate, a central portion of the S/D regions as well as portions of the S/D regions distal from the gate exposed for silicidation. Since the silicide sub-blocks are provided on both the first and second transistor S/D regions, this produces a symmetrical configuration of the transistor.

Other suitable silicide block patterns may also be useful. For example, any silicide block pattern which prevents silicidation of the STI edges adjacent to the gate on the drain or high voltage side of the transistor is also useful. For example, in some cases, the silicide block may extend from the outer edge of the drain to the outer edge of the source, including the gate. This configuration may be similar to that as described in FIGS. 9a-9b, except that the silicide sub-blocks 970 merge to be a single silicide block. Alternatively, the silicide block pattern may be formed in ring shape or in other suitable forms or shapes.

Figure 11A:
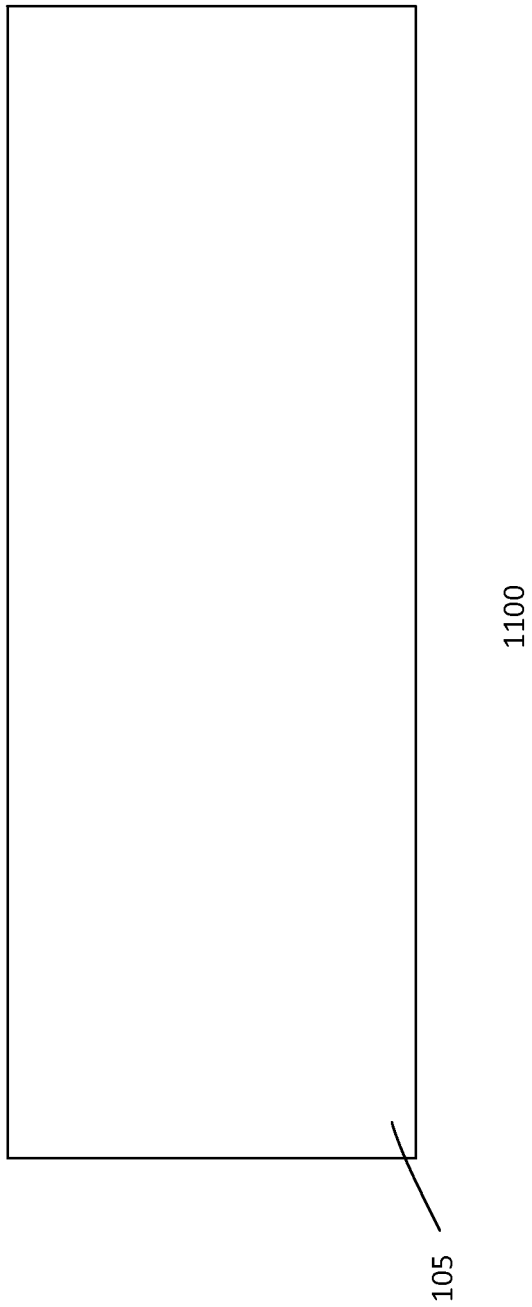

FIGS. 11a-11j show cross-sectional views of an embodiment of a process 1100 for forming a device. Referring to FIG. 11a, a substrate 105 is provided. The substrate, in one embodiment, is a silicon substrate. The substrate may be a doped substrate, such as a p-type substrate. Other types of substrates, such as a germanium-based, gallium arsenide, COI such as SOI, or sapphire, may also be useful. The substrate may be doped with other types of dopants or dopant concentrations. Providing an undoped substrate may also be useful.

Figure 11B:
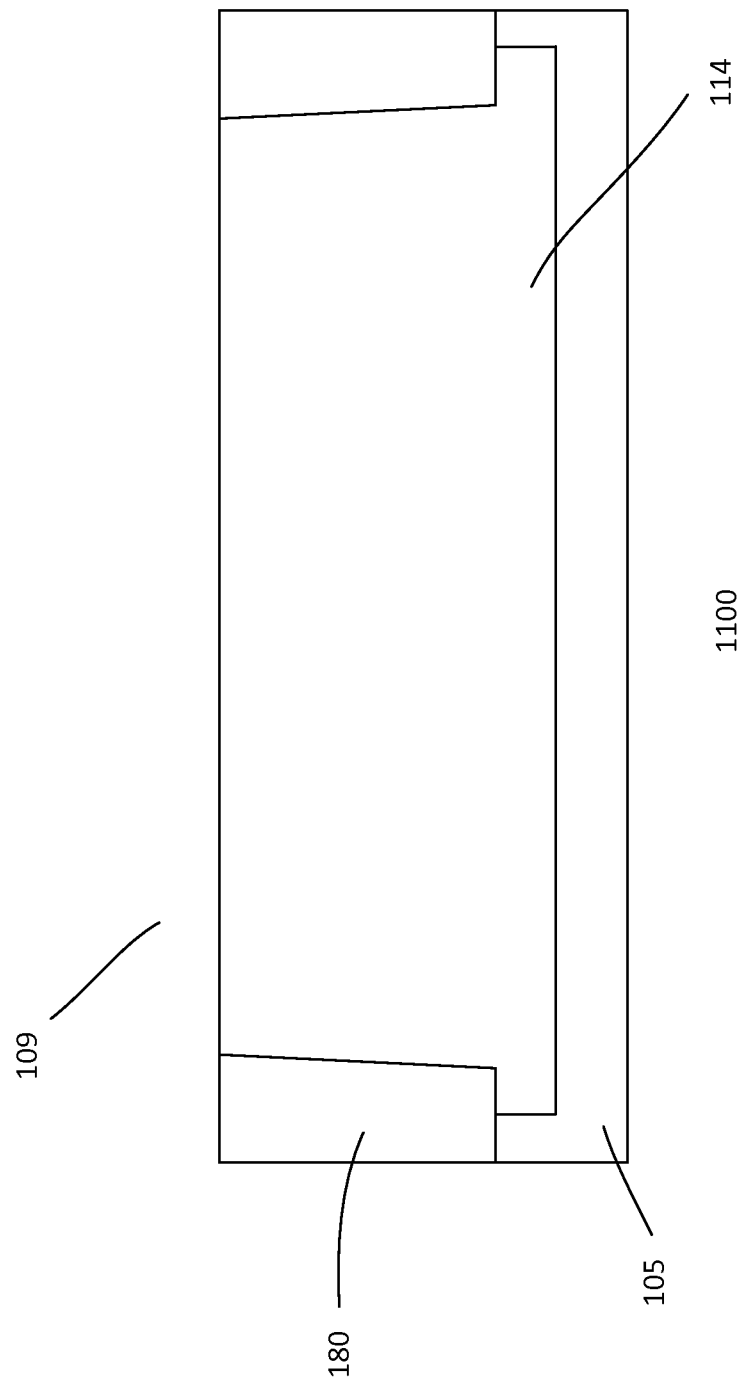

The substrate, as shown in FIG. 11b, includes a device region 109. In one embodiment, the device region is a high voltage (HV) device region. The substrate may also include device regions (not shown) for other types of circuitry, depending on the type of device or IC. The substrate is prepared with one or more isolation regions 180 for isolating the device region from other regions. For example, an isolation region surrounds a device region, isolating it from other device regions. The isolation regions are, for example, STI regions. Other types of isolation regions may also be useful. Various processes can be employed to form the STI regions. For example, the substrate can be etched using etch and mask techniques to form trenches which are then filled with dielectric materials such as silicon oxide. Chemical mechanical polishing (CMP) can be performed to remove excess oxide and provide a planar substrate top surface. Other processes or materials can also be used to form the STIs. The depth of the STI regions may be, for example, about 2000-5000 Å. Other depths for the STI regions may also be useful.

The substrate is prepared with a device well 114. The device well is disposed within the isolation region 180. A depth of the device well may be about 0.5-5 µm. Other depths for the device well may also be useful. In one embodiment, the device well is implanted with second polarity type dopants and serves as a body for a first polarity type device. For example, the device well may be doped with p-type dopants for an n-type device. Alternatively, the second polarity type dopants may be n-type. The dopant concentration of the device well may be light to intermediate. For example, the dopant concentration of the device well may be about $1E12-5E13/cm^2$. Other dopant concentrations for the device well may also be useful. The device well may be formed by ion implantation. For example, an ion implantation using an implant mask (not shown) which exposes the device region is performed to implant second polarity type dopants. The implant mask, for example, is a photoresist layer patterned by a lithographic mask. To improve lithographic resolution, an anti-reflective coating (ARC) may be used below the photoresist layer.

Figure 11C:
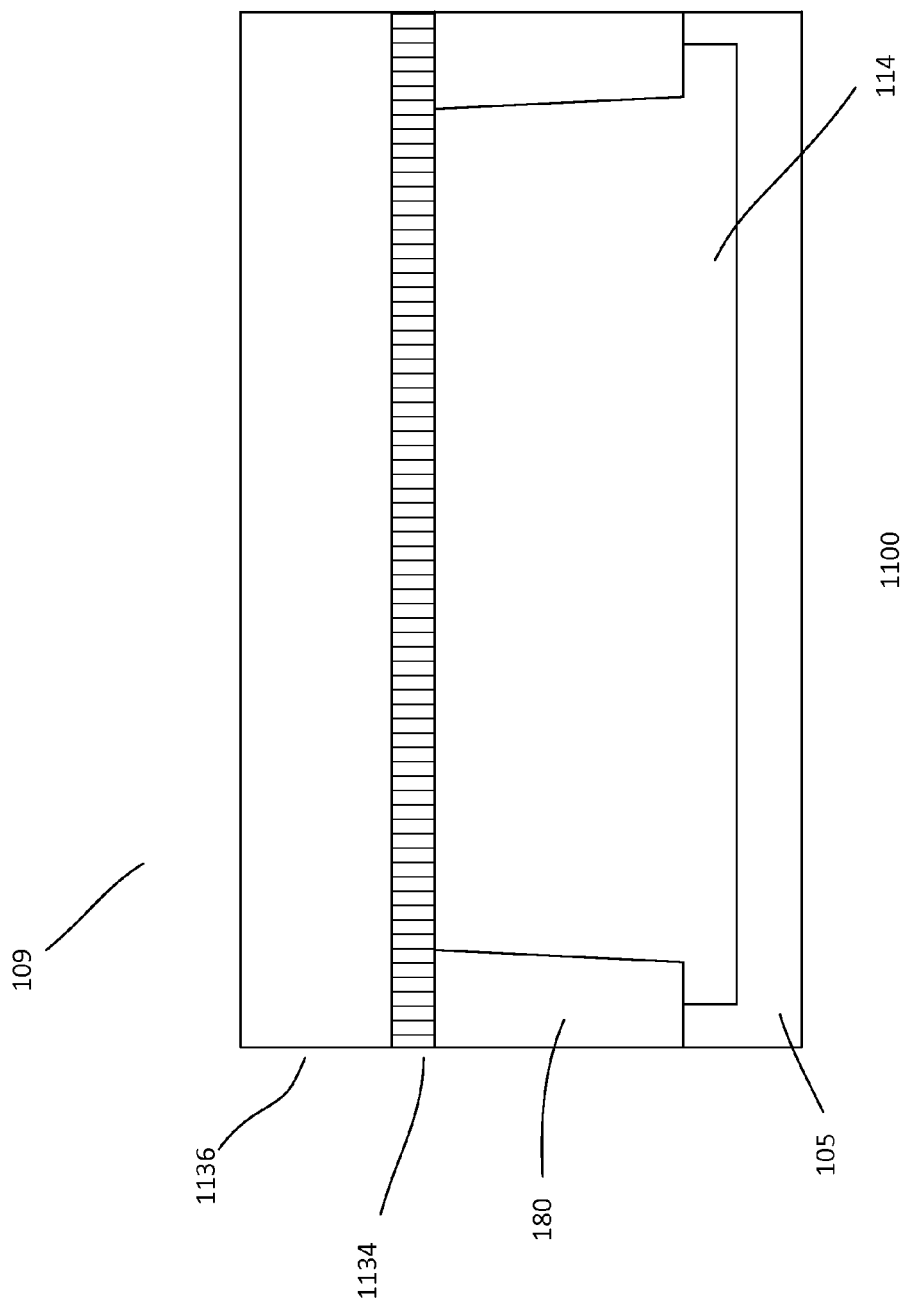

Referring to FIG. 11c, various layers of the gate are formed on the substrate. In one embodiment, the layers include a gate electrode layer 1136 over a gate dielectric layer 1134. The gate dielectric layer, as shown, is disposed on the substrate. The gate dielectric layer may be silicon oxide. Other types of gate dielectric layer, such as silicon oxynitride may also be useful. The gate dielectric layer, in one embodiment, is a HV gate dielectric layer. For example, the gate dielectric layer is sufficiently thick to accommodate a HV device. The thickness of the gate dielectric layer, in one embodiment, may be about 200-1000 Å. Other suitable thicknesses may also be useful. The gate dielectric layer may be formed by, for example, thermal oxidation. Other techniques or a combination of techniques may also be useful. For example, chemical vapor deposition (CVD) may be used to either form a high temperature oxide (HTO) layer or a low temperature oxide (LTO) layer.

As for the gate electrode layer, it is formed on the gate dielectric layer. The gate electrode layer, for example, may be a silicon layer. The silicon layer, for example, may be a polysilicon layer. The thickness of the gate electrode layer may be about 600-1600 Å. Other suitable thickness dimensions may also be useful. The gate electrode layer may be formed by, for example, CVD. Other suitable techniques for forming the gate electrode layer may also be useful. The gate electrode layer can be formed as an amorphous or non-amorphous layer. In the case of an amorphous layer, an anneal may be performed to form a polycrystalline silicon layer. Other configurations of gate dielectric and gate electrode layers may also be useful.

Figure 11D:
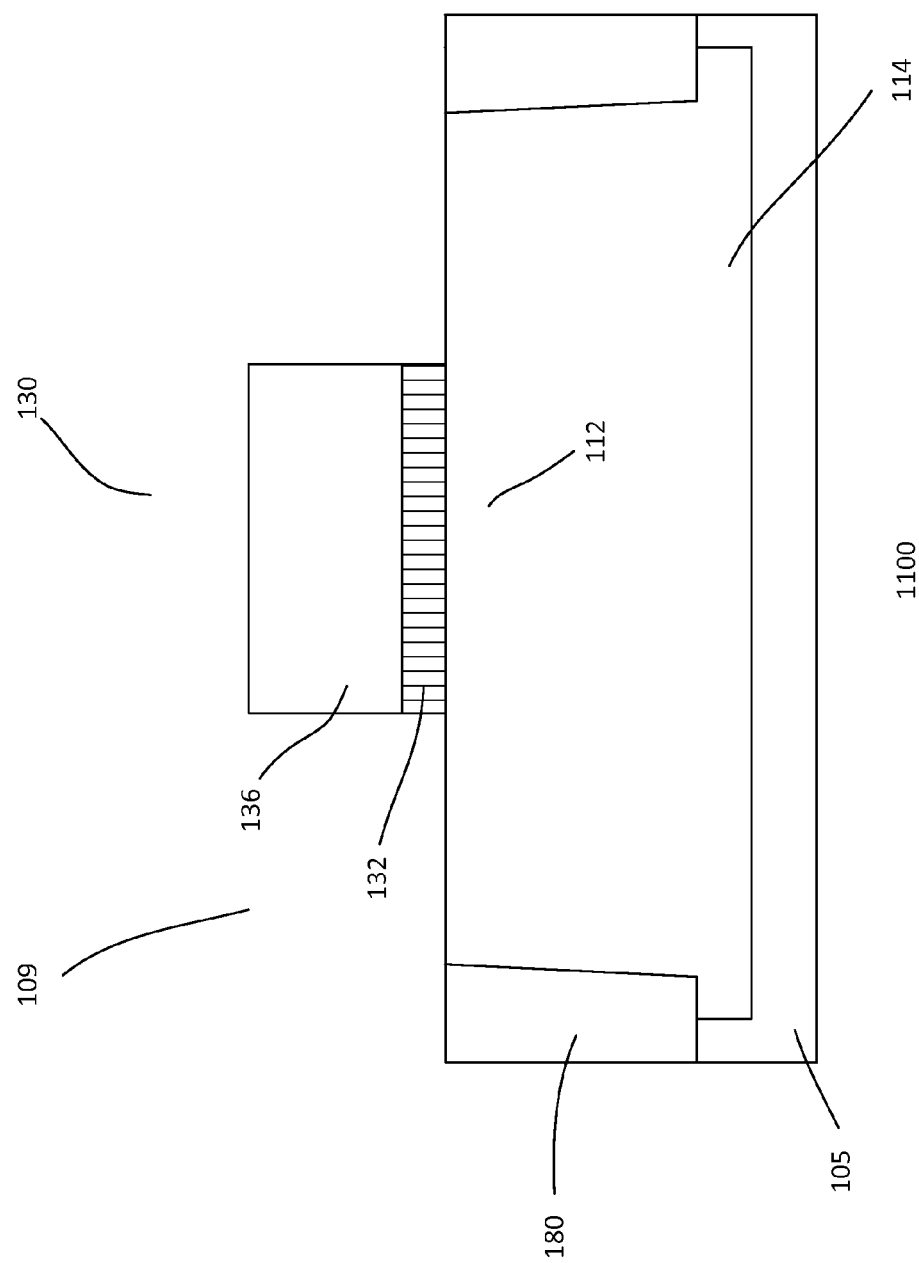

As shown in FIG. 11d, the gate layers are patterned to form a gate 130. An etch mask (not shown) may be employed to pattern the gate layers to form the gate. For example, a soft mask, such as a photoresist layer, may be used. An exposure source may selectively expose the photoresist layer through a reticle containing the desired pattern. After selectively exposing the photoresist layer, it is developed to form openings corresponding to locations where the gate electrode layer is to be removed. To improve lithographic resolution, an anti-reflective coating (ARC) may be used below the photoresist layer.

An anisotropic etch, such as reactive ion etching (RIE), is performed using the etch mask to pattern the gate layers, forming the gate having the patterned gate dielectric 132 and gate electrode 136. Other suitable types of etch processes may also be useful. The gate, for example, may be a gate conductor. Other configurations of the gates may also be useful. As shown, a channel 112 is located under the gate electrode and gate dielectric layer within the device well 114.

Figure 11E:
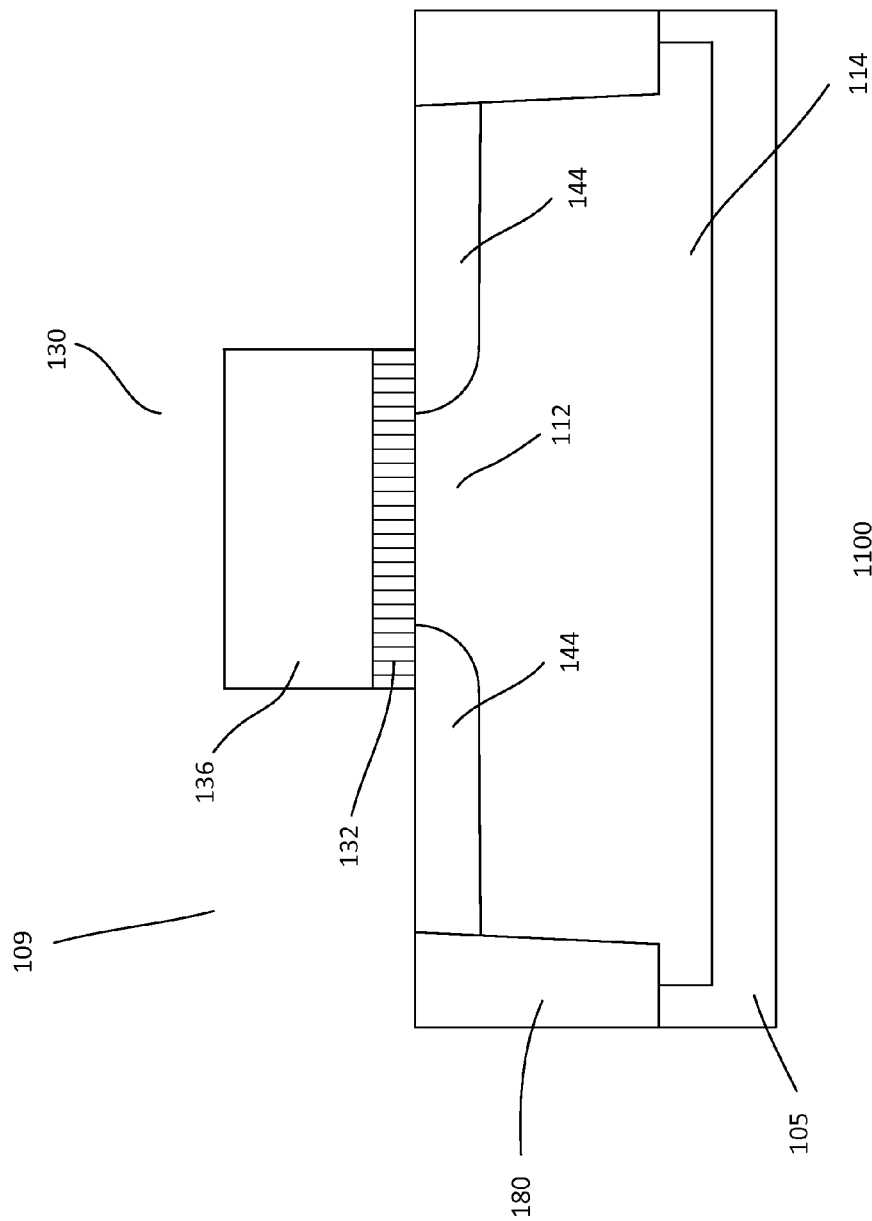

Referring to FIG. 11e, after forming the gate, the process continues to form lightly doped drain (LDD) extension regions 144. The LDD regions, for example, are formed by ion implantation. An implant mask (not shown), such as a photoresist, is formed over the substrate. The implant mask, for example, exposes the device region. The implant, using the implant mask, implants ions to form the LDD regions adjacent to the gate. For example, an angled implant may be employed to form the LDD regions. As illustrated, the LDD regions extend underneath the gate. The LDD regions, for example, may have a depth of about 40-80 nm with a dopant concentration of about 5E16-5E19/cm$^3$. Other suitable depths or dopant concentrations for the LDD regions may also be useful. The implant mask may be removed after forming the LDD regions. The implant mask may be removed by, for example, ashing. Other techniques for removing the implant mask may also be useful.

Figure 11F:
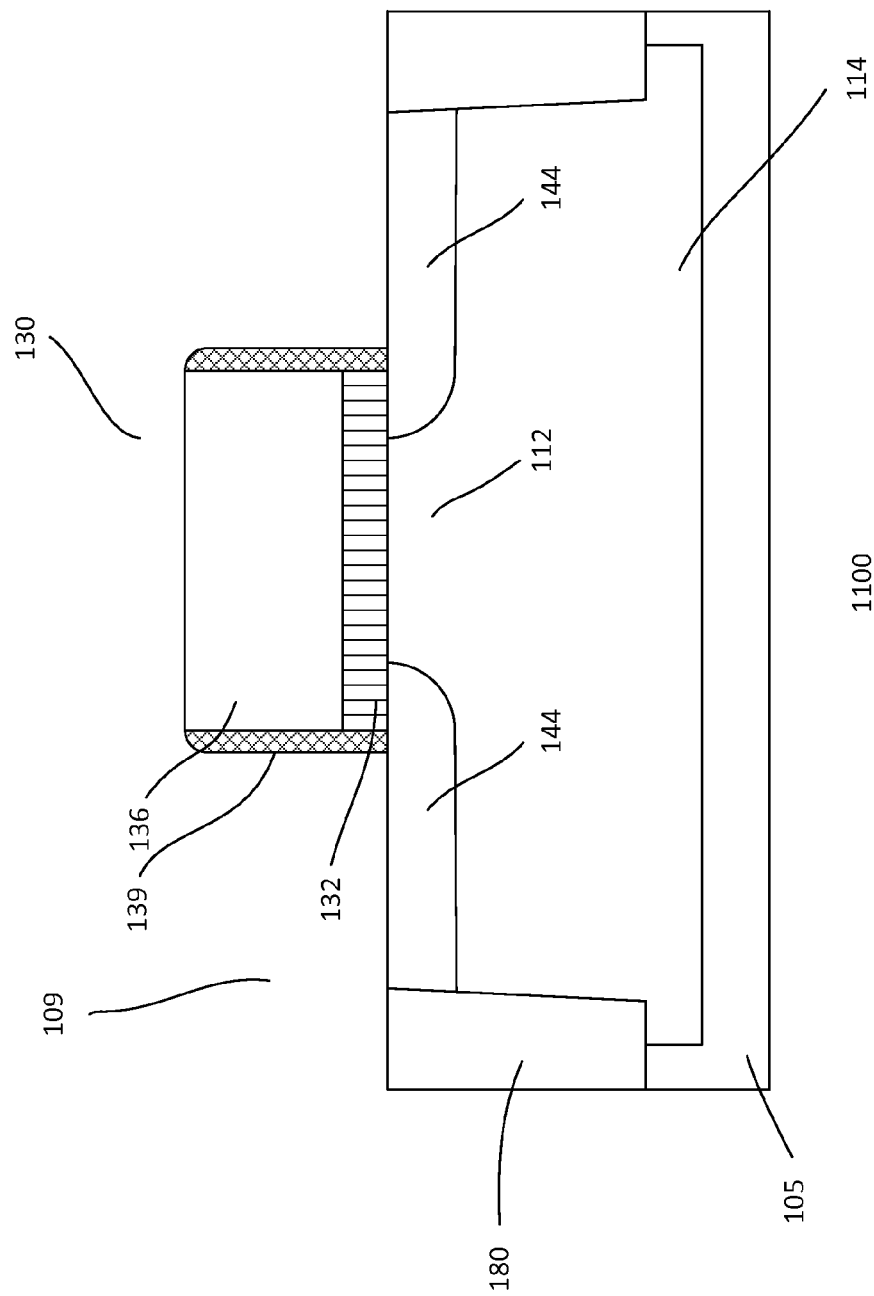

As shown in FIG. 11f, sidewall spacers 139 are formed on the sidewalls of the gate. For example, sidewall spacers are formed on sidewalls of the gate electrode 136 and sidewalls of the gate dielectric 132. To form the sidewall spacers, a dielectric layer is deposited on the substrate. The dielectric layer, for example, may be silicon oxide. Other types of dielectric material, such as silicon nitride, may also be used. The dielectric layer may be formed by CVD. The dielectric layer may also be formed using other techniques. Any suitable thicknesses for the dielectric layer may be useful. The thickness, for example, may depend on the desired width of the spacers. An anisotropic etch, such as RIE, may be performed to remove horizontal portions of the dielectric layer, leaving spacers on the sidewalls of the gate. The thickness of the spacers, for example, may be about 30 nm. Other thicknesses may also be useful. In some applications, the spacers may be formed from multiple dielectric layers, such as a combination of silicon oxide and silicon nitride. Other suitable combination of dielectric layers may also be useful.

Figure 11G:
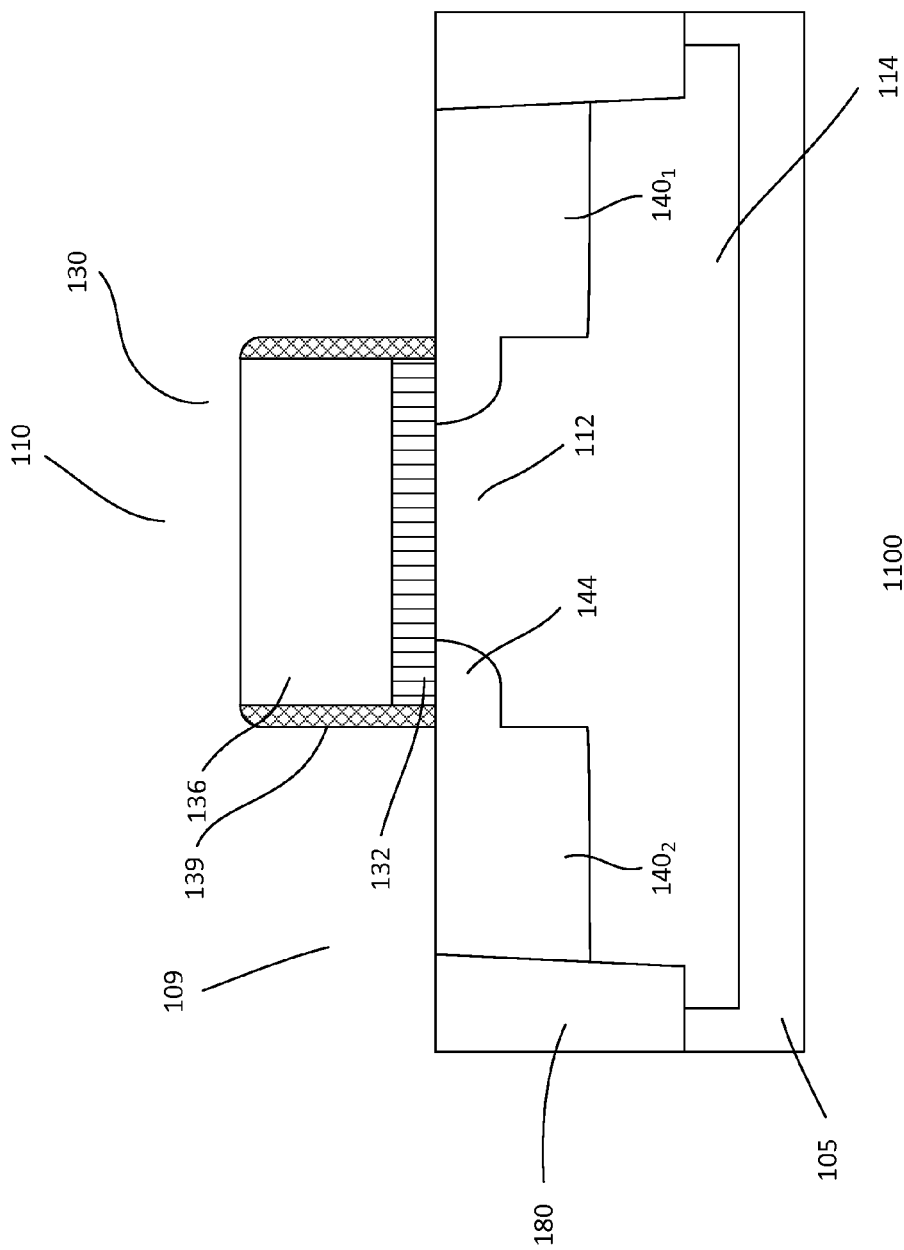

Referring to FIG. 11g, first and second transistor source/drain (S/D) regions 140$_1$-140$_2$ are formed in the substrate adjacent to the gate. The S/D regions are heavily doped regions having first polarity type dopants. An implant, for example, is performed using an implant mask (not shown), such as a photoresist mask. The implant mask exposes, for example, the device region. The implant mask may be formed with the same reticle as the one used to form the LDD implant mask. First polarity type dopants are implanted to form the heavily doped S/D regions. The S/D regions may be self-aligned to the edge of the spacers on the gate sidewalls. The S/D regions may have a depth of about 0.1-1 μm. Other depths may also be useful.

After forming the S/D regions, the implant mask is removed. The implant mask may be removed by, for example, ashing. Other techniques for removing the implant mask may also be useful. An anneal, such as RTA, is performed after the implant to activate the dopants in the S/D regions and the LDD regions. The inner edges of the heavily doped regions, for example, may extend under the sidewall spacers adjacent to the gate dielectric layer due to diffusion of the dopants from the doped regions.

Figure 11H:
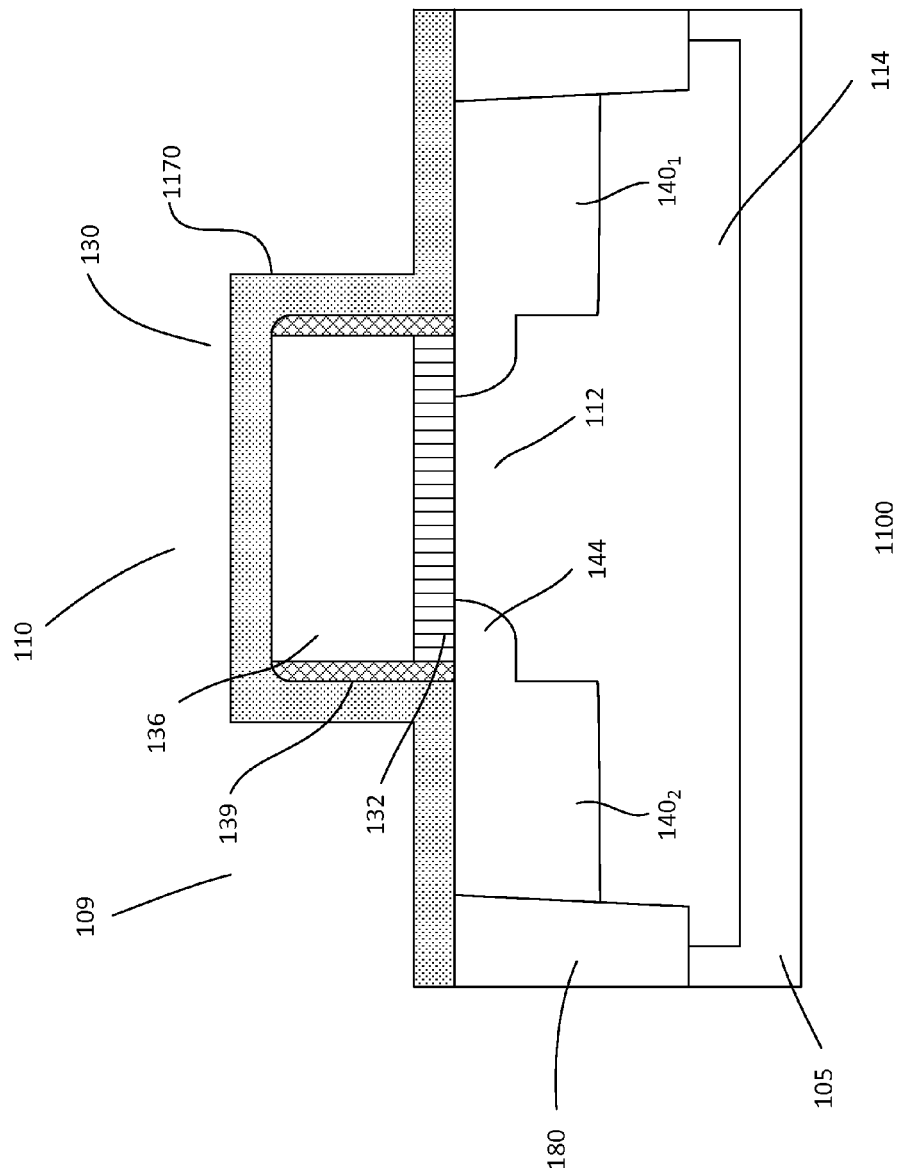

Referring to FIG. 11h, a silicide block layer 1170 is formed on the gate, gate sidewall spacers, and substrate including S/D regions and STI regions. The silicide block layer, for example, is formed of a dielectric material. Other types of materials which prevents silicidation may also be useful. In one embodiment, the silicide block layer is formed of silicon nitride. The thickness of the silicide block layer, in one embodiment, may be about 50 nm. Other suitable thicknesses may also be useful. The silicide block layer may be formed by, for example, chemical vapor deposition (CVD). Other suitable techniques for forming the silicide block layer may also be useful.

In FIG. 11i, the silicide block layer is patterned to form a silicide block 170. To pattern the silicide block layer, a mask (not shown) may be employed. The mask, for example, is a photoresist mask corresponding to the pattern of the silicide block. The pattern of the mask may correspond to the silicide block patterns described in FIGS. 1a-1b to FIGS. 10a-10b. Portions of the silicide block layer exposed by the mask are removed by, for example, an anisotropic etch, such as RIE. The etch, for example, may etch the silicide block layer selective to the substrate and STI. Patterning the silicide block layer forms the silicide block.

After forming the silicide block, metal silicide contacts 175 are formed on terminals or contact regions of the transistor. For example, the metal silicide contacts are formed on exposed silicon material in contact regions of the transistor. As shown, the source and exposed portion of the gate include silicide contacts, as described in FIGS. 1a-1b. Other configurations of silicide contacts may also be useful, depending on the pattern of the silicide block employed, as described in FIGS. 2a-2b to FIGS. 10a-10b or other described embodiments. The metal silicide contacts, for example, are cobalt or nickel based metal silicide contacts. Other types of metal silicide contacts may also be useful. The metal silicide contacts are used to facilitate low resistance contacts between the active substrate and BEOL metal lines disposed in metal level dielectric layers of the device. In one embodiment, the thickness of the silicide contacts is about 50-500 Å. Providing other thicknesses may also be useful.

The process for forming the metal silicide contacts includes a pre-clean process. The pre-clean process includes, for example, a dry anisotropic etch, wet isotropic etch or a combination thereof. Other suitable pre-clean techniques may also be employed. The process continues to deposit a metal layer on the surface of the substrate. The metal layer, for example, may be nickel or an alloy thereof. Other types of metallic layers, such as cobalt, or alloys thereof, including nickel, may also be used. The metal layer may be formed by physical vapor deposition (PVD). Other processes to form the metal layer may also be useful.

An anneal is performed to initiate a reaction between the metal layer and the substrate, forming a silicide layer. For example, the metal layer reacts with the exposed silicon surfaces of the gate electrode and S/D regions, forming silicide contacts. Metal layer disposed over non-silicon material is not reacted. Unreacted metal is removed by, for example, a wet removal process. For example, unreacted metal material is removed selective to the silicide contacts. Other techniques for forming the silicide contacts may also be useful.

As described, the silicide contacts are self-aligned to the S/D regions and gate electrode layer. This ensures that the complete exposed surfaces of the S/D regions and gate electrode are silicided. The metal silicide contacts may be employed to reduce contact resistance and facilitate contact to the back-end-of-line (BEOL) metal interconnects.

Figure 11J:
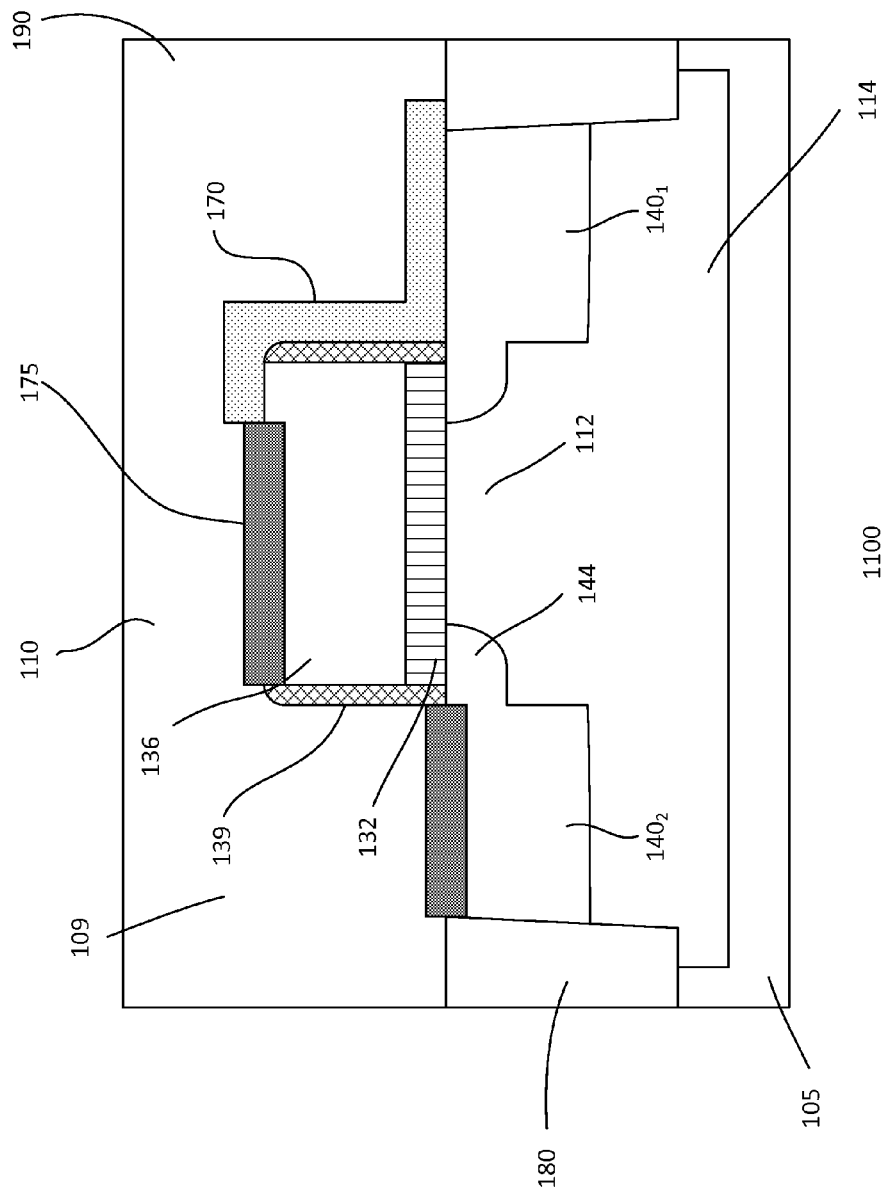

Referring to FIG. 11j, the process continues with additional processes to complete the formation of the device. These additional processes may include, for example, forming a pre-metal dielectric (PMD) layer and contacts to the terminals of the transistor as well as one or more interconnect levels, final passivation, dicing, assembly and packaging. Other processes may also be included.

The embodiments may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A high voltage device comprising:
   a substrate having a device region, the device region having a planar top surface with a length and a width direction, wherein first and second opposing width sides of the device region are along a channel width direction and first and second opposing length sides are along a channel length direction;
   an isolation region surrounding the opposing width and length sides of the device region, wherein isolation edges abut the opposing width and length sides of the device region;
   a transistor disposed in the device region, wherein the transistor includes a gate with first and second gate sidewalls, the gate includes a gate electrode over a gate dielectric, the gate is disposed on the top surface of the device region between first and second source/drain (S/D) regions, the first S/D region is adjacent to the first gate sidewall and the second S/D region is adjacent to the second gate sidewall, wherein top surfaces of the first and second S/D regions are co-planar with the top surface of the device region, the first S/D region is subject to a high voltage; and
   a silicide block disposed over a portion of the gate and over at least a portion of the first S/D region, the silicide block leaves a remaining portion of the gate uncovered while covering at least portions of isolation edges abutting the length sides of the device region adjacent and proximate to the first gate sidewall, the silicide block prevents formation of silicide over the silicide block, which includes at least portions of isolation edges abutting the length sides of the device region adjacent and proximate to the first gate sidewall.

2. The device of claim 1 wherein the silicide block comprises at least a first silicide block which covers the first gate sidewall along the width direction and at least a portion of the first S/D region along the length direction, covering including the isolation edges adjacent and proximate to the gate and the first S/D region.

3. The device of claim 2 wherein the first silicide block covers at least the isolation edges adjacent and proximate to the first gate sidewall along the width direction while covering a complete portion of the first S/D region.

4. The device of claim 3 further comprises a second silicide block covering at least the isolation edges adjacent and proximate to the second gate sidewall along the width direction while covering a complete portion of the second S/D region.

5. The device of claim 2 wherein the first silicide block covers at least the isolation edges adjacent and proximate to the first gate sidewall along the width direction while exposing a distal portion of the first S/D region.

6. The device of claim 5 further comprises a second silicide block covering at least the isolation edges adjacent and proximate to the second gate sidewall along the width direction while exposing a distal portion of the second S/D region.

7. The device of claim 2 wherein the first silicide block comprises at least first and second silicide sub-blocks which cover the first gate sidewall along the width direction and the first S/D region on opposing length sides along the length direction, covering the isolation edges adjacent and proximate to the gate and the first S/D region.

8. The device of claim 7 wherein the first and second silicide sub-blocks of the first silicide blocks expose a central and a distal portions of the first S/D region.

9. The device of claim 7 further comprises a second silicide block comprising at least first and second silicide sub-blocks which cover the second gate sidewall along the width direction and the second S/D region on opposing length sides along the length direction, covering the isolation edges adjacent and proximate to the gate and the second S/D region.

10. The device of claim 9 wherein the first and second silicide sub-blocks of the first and second silicide blocks expose the central and distal portions of the first and second S/D regions.

11. The device of claim 1 wherein:
    the silicide block comprises at least a first silicide block which covers the gate and the first and second S/D regions on the same opposing side along the length direction, and
    covering the isolation edges adjacent and proximate to the gate and the first and second S/D regions.

12. The device of claim 11 wherein the at least first silicide block exposes the central and distal portions of the first and second S/D regions.

13. A method for forming a high voltage device comprising:
    providing a substrate having a device region, the device region having a planar top surface with a length and a width direction, wherein first and second opposing width sides of the device region are along a channel width direction and first and second opposing length sides are along a channel length direction;
    forming an isolation region surrounding the opposing width and length sides of the device region, wherein isolation edges abut the opposing width and length sides of the device region;
    forming a transistor in the device region, wherein the transistor includes a gate with first and second gate sidewalls, the gate includes a gate electrode over a gate dielectric, the gate is disposed on the top surface of the device region between first and second source/drain (S/D) regions, the first S/D region is adjacent to the first gate sidewall and the second S/D region is adjacent to the second gate sidewall, wherein top surfaces of the first and second S/D regions are co-planar with the top surface of the device region, the first S/D region is subject to a high voltage; and
    forming a silicide block over a portion of the gate and over at least a portion of the first S/D region, the silicide block leaves a remaining portion of the gate uncovered while covering at least portions of isolation edges abutting the length sides of the device region adjacent and proximate to the first gate sidewall, the silicide block prevents formation of silicide over the silicide block, which includes at least portions of isolation edges abutting the length sides of the device region adjacent and proximate to the first gate sidewall.

14. The method of claim 13 wherein forming the silicide block comprises forming at least a first silicide block which covers the first gate sidewall along the width direction and at least a portion of the first S/D region along the length direction, covering the isolation edges adjacent and proximate to the gate and the first S/D region.

15. The method of claim 14 wherein the first silicide block covers at least the isolation edges adjacent and proximate to the first gate sidewall along the width direction while covering a complete portion of the first S/D region.

16. The method of claim 14 wherein the first silicide block covers at least the isolation edges adjacent and proximate to the first gate sidewall along the width direction while exposing a distal portion of the first S/D region.

17. The method of claim 14 further comprises a second silicide block covering at least the isolation edges adjacent and proximate to the second gate sidewall along the width direction while covering a complete portion of the second S/D region.

18. The method of claim 17 wherein the second silicide block covers at least the isolation edges adjacent and proximate to the second gate sidewall along the width direction while exposing a distal portion of the second S/D region.

19. The method of claim 14 wherein the first silicide block comprises at least first and second silicide sub-blocks which cover the first gate sidewall along the width direction and the first S/D region on opposing length sides along the length direction, covering the isolation edges adjacent and proximate to the gate and the first S/D region.

20. The method of claim 14 wherein forming the silicide block comprises patterning a silicide block layer by using a mask.

* * * * *